United States Patent
Nishimura et al.

(10) Patent No.: US 9,261,785 B2
(45) Date of Patent: Feb. 16, 2016

(54) POLYMER COMPOUND, RESIN COMPOSITION FOR PHOTORESISTS, AND METHOD FOR PRODUCING SEMICONDUCTOR

(71) Applicant: DAICEL CORPORATION, Osaka-shi, Osaka (JP)

(72) Inventors: Masamichi Nishimura, Himeji (JP); Akira Eguchi, Himeji (JP); Mitsuru Ohno, Himeji (JP)

(73) Assignee: Daicel Corporation, Osaka-shi (JP)

( * ) Notice: Subject to any disclaimer, the term of this patent is extended or adjusted under 35 U.S.C. 154(b) by 0 days.

(21) Appl. No.: 14/406,238

(22) PCT Filed: Jun. 17, 2013

(86) PCT No.: PCT/JP2013/066577
§ 371 (c)(1),
(2) Date: Dec. 8, 2014

(87) PCT Pub. No.: WO2014/002810
PCT Pub. Date: Jan. 3, 2014

(65) Prior Publication Data
US 2015/0168831 A1 Jun. 18, 2015

(30) Foreign Application Priority Data
Jun. 29, 2012 (JP) .................................. 2012-147874
Jun. 29, 2012 (JP) .................................. 2012-147875

(51) Int. Cl.
*G03F 7/039* (2006.01)
*C08F 220/18* (2006.01)
*H01L 21/02* (2006.01)
*C08F 220/38* (2006.01)
*H01L 21/027* (2006.01)
*C08F 222/14* (2006.01)
*C08F 222/22* (2006.01)
*C08F 220/28* (2006.01)
*G03F 7/038* (2006.01)

(52) U.S. Cl.
CPC ............ *G03F 7/0392* (2013.01); *C08F 220/18* (2013.01); *C08F 220/28* (2013.01); *C08F 220/38* (2013.01); *C08F 222/14* (2013.01); *C08F 222/22* (2013.01); *G03F 7/038* (2013.01); *G03F 7/0397* (2013.01); *H01L 21/0274* (2013.01); *H01L 21/02118* (2013.01); *C08F 2220/382* (2013.01)

(58) Field of Classification Search
None
See application file for complete search history.

(56) References Cited

U.S. PATENT DOCUMENTS

| | | | |
|---|---|---|---|
| 6,042,991 A | 3/2000 | Aoai et al. | |
| 6,291,130 B1 | 9/2001 | Kodama et al. | |
| 6,479,209 B1 | 11/2002 | Aoai et al. | |
| 6,517,991 B1 | 2/2003 | Kodama et al. | |
| 6,632,586 B1 | 10/2003 | Aoai et al. | |
| 6,982,140 B2 | 1/2006 | Hada et al. | |
| 2003/0044718 A1 | 3/2003 | Kodama et al. | |
| 2004/0058269 A1 | 3/2004 | Hada et al. | |

FOREIGN PATENT DOCUMENTS

| | | |
|---|---|---|
| JP | 10-221852 A | 8/1998 |
| JP | 10-232495 A | 9/1998 |
| JP | 10-239847 A | 9/1998 |
| JP | 10-307397 A | 11/1998 |
| JP | 11-109628 A | 4/1999 |
| JP | 11-282163 A | 10/1999 |
| JP | 2000-47386 A | 2/2000 |

(Continued)

OTHER PUBLICATIONS

International Search Report for PCT/JP2013/066577 mailed on Aug. 6, 2013.

*Primary Examiner* — Cynthia Hamilton
(74) *Attorney, Agent, or Firm* — Birch, Stewart, Kolasch & Birch, LLP

(57) ABSTRACT

Provided is a polymer compound that has excellent sensitivity, high resolution, and small line edge roughness and is capable of forming a fine pattern precisely, and less causes post-develop defects.

The polymer compound according to the present invention includes a monomer unit (a) and a monomer unit (b). The monomer unit (a) is represented by Formula (a), and the monomer unit (b) includes an alicyclic skeleton containing a polar group. The polar group of the monomer unit (b) is preferably at least one group selected from —O—, —C(=O)—, —C(=O)—O—, —O—C(=O)—O—, —C(=O)—O—C(=O)—, —C(=O)—NH—, —S(=O)—O—, —S(=O)$_2$—O—, —OR$^a$, —C(=O)—OR$^a$, and —CN, where R$^a$ represents, independently in each occurrence, optionally substituted alkyl.

[Chem. 1]

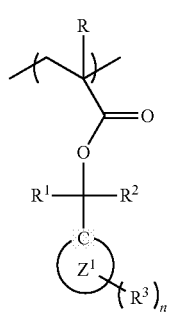

(a)

20 Claims, No Drawings

(56) References Cited

FOREIGN PATENT DOCUMENTS

| JP | 2000-98613 A | 4/2000 |
|----|---|---|
| JP | 2002-107920 A | 4/2002 |
| JP | 2003-223001 A | 8/2003 |
| JP | 3751065 B2 | 3/2006 |
| JP | 3803286 B2 | 8/2006 |
| JP | 2010-197615 A | 9/2010 |

US 9,261,785 B2

POLYMER COMPOUND, RESIN COMPOSITION FOR PHOTORESISTS, AND METHOD FOR PRODUCING SEMICONDUCTOR

TECHNICAL FIELD

The present invention relates to polymer compounds and photoresist resin compositions each for use typically in micromachining of semiconductor structures; and methods for producing semiconductor structures.

BACKGROUND ART

Positive photoresists for use in semiconductor structure production processes should simultaneously have properties such as the property of becoming alkali-soluble in an irradiated portion upon light irradiation; adhesion to a silicon wafer; and plasma etch resistance. The positive photoresists each generally include a polymer as a base resin, a photoacid generator, and some kinds of additives to adjust the properties.

With finer design rules of semiconductor integrated circuits, exposing sources with shorter and shorter wavelengths have been used in lithography for semiconductor production. The exposing sources are now moving from KrF excimer laser at a wavelength of 248 nm to ArF excimer laser at a wavelength of 193 nm. Resist polymers for use in KrF or ArF excimer laser exposure include monomer units that release a moiety thereof by the action of an acid generated from a photoacid generator and exhibit solubility in an alkaline developer. Some of known monomer units of this type contain an acid-leaving group including a large alicyclic structure and are exemplified by a monomer unit derived from 2-methyl-2-methacryloyloxyadamantane, and a monomer unit derived from 1-(1-methacryloyloxy-1-methylethyl)adamantane (Patent Literature (PTL) 1, PTL 2, and PTL 3). Resins for photoresists containing any of these monomer units are, however, insufficient in resolution, pattern shape, and/or developability.

In contrast, others of the specific monomer units contain an acid-leaving group including a small alicyclic structure and are exemplified by a monomer unit derived from 1-(1-methacryloyloxyethyl)cyclopropane (PTL 4). Resins for photoresist including the monomer unit are, however, insufficient in sensitivity.

CITATION LIST

Patent Literature

PTL 1: Japanese Patent No. 3751065
PTL 2: Japanese Patent No. 3803286
PTL 3: Japanese Unexamined Patent Application Publication (JP-A) No. 2003-223001
PTL 4: JP-A No. 2010-197615

SUMMARY OF INVENTION

Technical Problem

Accordingly, an object of the present invention is to provide a polymer compound and a photoresist resin composition, both of which have excellent sensitivity and high resolution, have small line edge roughness (LER), enable precise, fine patterning, and less cause post-develop defects.

Another object of the present invention is to provide a polymer compound and a photoresist resin composition, both of which have excellent sensitivity, high resolution, and excellent etch resistance, have small line edge roughness (LER), enable precise, fine patterning, and less cause post-develop defects.

Yet another object of the present invention is to provide a method for producing a semiconductor structure using the polymer compound and/or the photoresist resin composition.

Solution to Problem

After intensive investigations to achieve the objects, the inventors obtained findings as follows. There is a polymer compound including a monomer unit containing an acid-leaving group with a large alicyclic structure as a monomer unit that releases its moiety by the action of an acid to exhibit alkali solubility. When the polymer compound is used in a photoresist resin composition, a compound (moiety) left by the action of the acid and including the large alicyclic structure has poor solubility in an alkaline developer and remains as scum on a substrate surface even after development. This impairs line edge roughness (LER) and causes post-develop defects. The inventors further found the use of a specific polymer compound in a photoresist resin composition, where the polymer compound includes both a specific first monomer unit and a second monomer unit, where the first monomer unit contains an acid-leaving group including a small alicyclic structure containing three or four carbon atoms, and the second monomer unit includes an alicyclic skeleton containing a polar group. Specifically, the inventors obtained findings as follows. The monomer unit containing an acid-leaving group including such a small alicyclic structure releases the acid-leaving group upon light irradiation with good sensitivity to exhibit alkali solubility, namely, the monomer unit has very high reactivity with an acid. The left group including the small alicyclic structure is satisfactorily soluble in an alkaline developer and can be easily removed from the substrate surface upon development. The polymer compound in the photoresist does not approximately cause scum (i.e., a resist residue), contributes to reduction in line edge roughness (LER), and less causes post-develop defects, namely, provides high resolution. The inventors further found that a photoresist resin composition including a specific polymer compound has high resolution and still has excellent etch resistance, where the polymer compound includes a first monomer unit and a second monomer unit as monomer units that release its moiety by the action of an acid and exhibit alkali solubility, where the first monomer unit is the specific monomer unit containing an acid-leaving group including a small alicyclic structure, and the second monomer unit contains a group including a large $C_5$-$C_{20}$ alicyclic structure. The inventors also found that the polymer compound, when used as a resin for photoresists, can give a resist film by which a desired fine pattern can be precisely formed. The present invention has been made based on these findings.

Specifically, the present invention provides a polymer compound including a monomer unit (a) and a monomer unit (b). The monomer unit (b) includes an alicyclic skeleton containing a polar group. The monomer unit (a) is represented by Formula (a):

[Chem. 1]

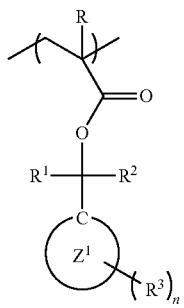
(a)

wherein R is selected from hydrogen, halogen, and optionally halogenated $C_1$-$C_6$ alkyl; $R^1$ and $R^2$ each represent, identically or differently, optionally substituted $C_1$-$C_6$ alkyl; $R^3$ is a substituent bonded to Ring $Z^1$ and is, independently in each occurrence, selected from oxo, alkyl, optionally protected hydroxyl, optionally protected hydroxyalkyl, optionally protected carboxy, and cyano; n represents an integer from 0 to 3, where, when n is 2 or 3, two or three occurrences of $R^3$ may be identical or different; and Ring $Z^1$ represents a $C_3$ or $C_4$ alicyclic hydrocarbon ring.

The polar group of the monomer unit (b) preferably includes at least one group selected from the group consisting of —O—, —C(=O)—, —C(=O)—O—, —O—C(=O)—O—, —C(=O)—O—C(=O)—, —C(=O)—NH—, —S(=O)—O—, —S(=O)$_2$—O—, —OR$^a$, —C(=O)—OR$^a$, and —CN, where R$^a$ represents, independently in each occurrence, optionally substituted alkyl.

The monomer unit (b) preferably includes at least one selected from the group consisting of monomer units (b1) to (b6) respectively represented by Formulae (b1) to (b6):

[Chem. 2]

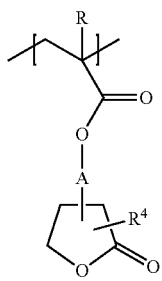
(b1)

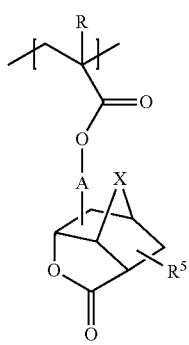
(b2)

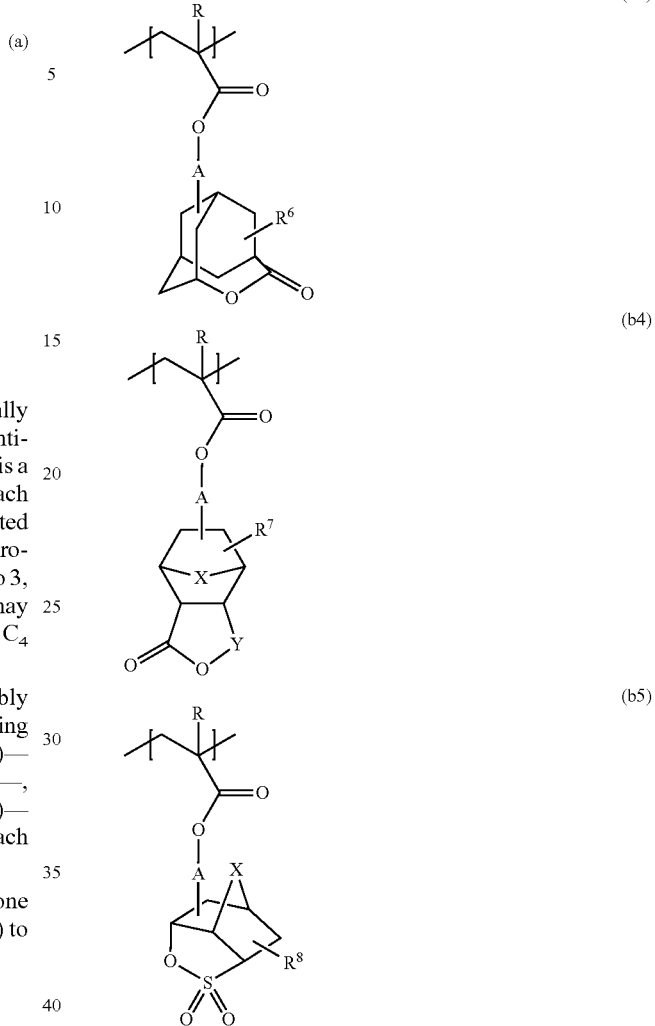
(b3)

(b4)

(b5)

(b6)

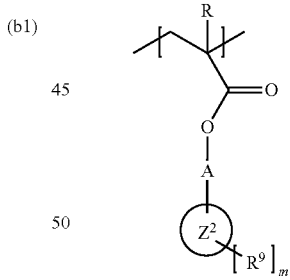

wherein R is, independently in each occurrence, selected from hydrogen, halogen, and optionally halogenated $C_1$-$C_6$ alkyl; A is, independently in each occurrence, selected from a single bond and a linkage group; X is, independently in each occurrence, selected from non-bond, methylene, ethylene, oxygen, and sulfur; Y is selected from methylene and carbonyl; $R^4$, $R^5$, $R^6$, $R^7$, and $R^8$ are each, identically or differently, selected from hydrogen, alkyl, optionally protected hydroxyl, optionally protected hydroxyalkyl, optionally protected carboxy, and cyano; $R^9$ is, independently in each occurrence, selected from optionally protected hydroxyl, optionally protected hydroxyalkyl, optionally protected carboxy, and cyano; Ring $Z^2$ represents a $C_6$-$C_{20}$ alicyclic hydrocarbon ring; and m represents an integer from 1 to 5.

The polymer compound according to the present invention preferably further includes at least one monomer unit (c) selected from the group consisting of monomer units (c1) to (c4) respectively represented by Formula (c1) to (c4):

[Chem. 3]

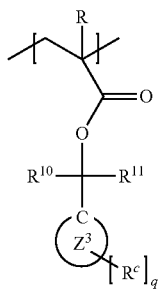

(c1)

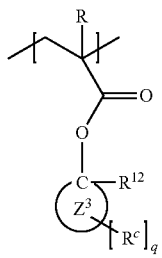

(c2)

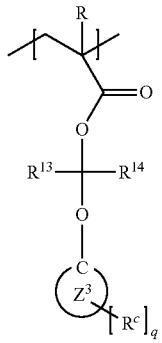

(c3)

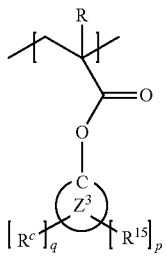

(c4)

wherein R is, independently in each occurrence, selected from hydrogen, halogen, and optionally halogenated $C_1$-$C_6$ alkyl; $R^{10}$, $R^{11}$, and $R^{12}$ each represent, identically or differently, optionally substituted $C_1$-$C_6$ alkyl; $R^{13}$ and $R^{14}$ are each, identically or differently, selected from hydrogen and optionally substituted $C_1$-$C_6$ alkyl; $R^{15}$ represents, independently in each occurrence, —$COOR^d$, where $R^d$ is selected from an optionally substituted tertiary hydrocarbon group, tetrahydrofuranyl, tetrahydropyranyl, and oxepanyl; p represents an integer from 1 to 3; $R^c$ is a substituent bonded to Ring $Z^3$ and is, identically or differently in each occurrence, selected from oxo, alkyl, optionally protected hydroxyl, optionally protected hydroxyalkyl, and optionally protected carboxy; q represents an integer from 0 to 3; and Ring $Z^3$ represents, independently in each occurrence, a $C_5$-$C_{20}$ alicyclic hydrocarbon ring.

The polymer compound preferably has a weight-average molecular weight of from 1000 to 50000 and preferably has a molecular weight distribution of from 1.0 to 3.0, where the molecular weight distribution is the ratio Mw/Mn of the weight-average molecular weight Mw to a number-average molecular weight Mn.

The present invention also provides a photoresist resin composition. The resin composition includes the polymer compound, a photoacid generator, and an organic solvent.

In addition and advantageously, the present invention provides a method for producing a semiconductor structure. The method includes forming a pattern using the photoresist resin composition.

Advantageous Effects of Invention

The polymer compound according to the present invention includes a monomer unit derived from a specific unsaturated carboxylic acid ester containing a $C_3$ or $C_4$ alicyclic hydrocarbon group as a monomer unit that releases its moiety by the action of an acid to exhibit alkali solubility. The polymer compound thereby has extremely high reactivity with the acid to release a compound as a moiety thereof by the action of the acid, where the left compound can be easily removed. The polymer compound thereby causes approximately not scum. In addition, the polymer compound includes a monomer unit containing a polar-group-containing alicyclic skeleton and thereby adheres satisfactorily to a substrate and has excellent etch resistance.

In an embodiment, the polymer compound includes both a first monomer unit and a second monomer unit as monomer units that release a moiety thereof by the action of an acid to exhibit alkali solubility, where the first monomer unit is the monomer unit derived from the specific unsaturated carboxylic acid ester including the small $C_3$ or $C_4$ alicyclic structure, and the second monomer unit is a monomer unit derived from an unsaturated carboxylic acid ester containing an acid-leaving group including a large $C_5$-$C_{20}$ alicyclic structure. This polymer compound has extremely high reactivity with an acid and releases a compound as a moiety thereof by the action of the acid, where the left compound can be easily removed from the substrate surface. The polymer compound thereby causes approximately no scum, contributes to reduction in line edge roughness (LER), and can exhibit still better etch resistance.

The method for producing a semiconductor structure using the photoresist resin composition according to the present invention employs the polymer compound having excellent properties as mentioned above as a resist and enables precise formation of a fine pattern.

DESCRIPTION OF EMBODIMENTS

Polymer Compound

The polymer compound according to an embodiment of the present invention includes a monomer unit (a) and a monomer unit (b), where the monomer unit (a) is represented by Formula (a), and the monomer unit (b) includes an alicyclic skeleton containing a polar group. The polymer compound according to the present invention may further include a monomer unit (c) in addition to the monomer unit (a) and the monomer unit (b).

Monomer Unit (a)

The monomer unit (a) in the present invention is represented by Formula (a) and rapidly releases an acid-leaving group (carboxy-protecting group) by the action of an acid to form a carboxy group that contributes to the development of alkali solubility. The monomer unit (a) herein imparts, to the polymer compound, a property of becoming alkali-soluble by the action of an acid. The monomer unit (a) herein can be introduced into the polymer compound by subjecting an unsaturated carboxylic acid ester represented by Formula (a-1) to polymerization, where Formula (a-1) is expressed as follows:

[Chem. 4]

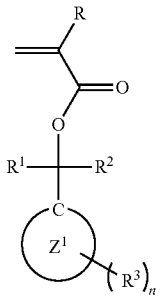

(a-1)

In Formula (a-1), R, $R^1$, $R^2$, $R^3$, n, and Ring $Z^1$ respectively correspond to R, $R^1$, $R^2$, $R^3$, n, and Ring $Z^1$ in Formula (a). Specifically, R is selected from hydrogen, halogen, and optionally halogenated $C_1$-$C_6$ alkyl. $R^1$ and $R^2$ each represent, identically or differently, optionally substituted $C_1$-$C_6$ alkyl. $R^3$ is a substituent bonded to Ring $Z^1$ and is, independently in each occurrence, selected from oxo, alkyl, optionally protected hydroxyl, optionally protected hydroxyalkyl, optionally protected carboxy, and cyano. A repetition number n represents an integer from 0 to 3. When n is 2 or 3, two or three occurrences of $R^3$ may be identical or different. Ring $Z^1$ represents a $C_3$ or $C_4$ alicyclic hydrocarbon ring.

The unsaturated carboxylic acid ester represented by Formula (a-1) may be produced typically by subjecting an organometallic compound represented by Formula (1) or (2) to an addition reaction with a ketone represented by Formula (3) to give an addition reaction product, and allowing the product to react with an unsaturated carboxylic halide represented by Formula (4) in the presence of a tertiary amine. Formulae (1), (2), (3), and (4) are expressed as follows:

$R^1MgX^1$ (1)

$R^1Li$ (2)

wherein $R^1$ represents, independently in each occurrence, optionally substituted $C_1$-$C_6$ alkyl; and $X^1$ represents halogen,

[Chem. 5]

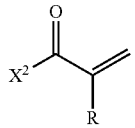

(3)

wherein $R^2$ represents optionally substituted $C_1$-$C_6$ alkyl; Ring $Z^1$ represents a $C_3$ or $C_4$ alicyclic hydrocarbon ring; $R^3$ is a substituent bonded to Ring $Z^1$ and is, independently in each occurrence, selected from oxo, alkyl, optionally protected hydroxyl, optionally protected hydroxyalkyl, optionally protected carboxy, and cyano; and n represents an integer from 0 to 3, where, when n is 2 or 3, two or three occurrences of $R^3$ may be identical or different,

[Chem. 6]

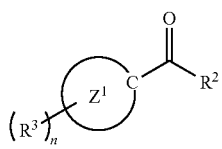

(4)

wherein R is selected from hydrogen, halogen, and optionally halogenated $C_1$-$C_6$ alkyl; and $X^2$ represents halogen.

In the present invention, the addition reaction product between the organometallic compound represented by Formula (1) or (2) and the ketone represented by Formula (3) is a tertiary alcohol-organometallic compound adduct, where the adduct is represented by Formula (5-1) upon the use of the organometallic compound represented by Formula (1), and is represented by Formula (5-2) upon the use of the organometallic compound represented by Formula (2), where Formulae (5-1) and (5-2) are expressed as follows:

[Chem. 7]

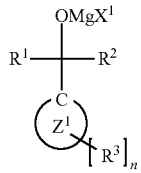

(5-1)

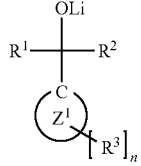

(5-2)

wherein $R^1$, $R^2$, $R^3$, n, Ring $Z^1$, and $X^1$ are as defined above.

Specifically, the unsaturated carboxylic acid ester represented by Formula (a-1) may be produced through first and second steps as follows.

The first step is the step of allowing the organometallic compound represented by Formula (1) or (2) to react with the ketone represented by Formula (3) to give the tertiary alcohol-organometallic compound adduct, where the adduct is represented by Formula (5-1) upon the use of the organometallic compound represented by Formula (1), or is represented by Formula (5-2) upon the use of the organometallic compound represented by Formula (2).

The second step is the step of allowing the tertiary alcohol-organometallic compound adduct represented by Formula (5-1) or (5-2) to react with the unsaturated carboxylic halide represented by Formula (4) in the presence of a tertiary amine to form the unsaturated carboxylic acid ester represented by Formula (a-1).

In Formula (1) or (2), $R^1$ represents, independently in each occurrence, optionally substituted $C_1$-$C_6$ alkyl and corresponds to $R^1$ in Formula (a-1). The $C_1$-$C_6$ alkyl is exemplified by methyl, ethyl, propyl, isopropyl, butyl, isobutyl, s-butyl, t-butyl, pentyl, isoamyl, s-amyl, t-amyl, and hexyl. Among them, $C_1$-$C_4$ alkyl is preferred.

The $C_1$-$C_6$ alkyl as $R^1$ may have one or more substituents. The substituents are exemplified by halogen, hydroxy, substituted hydroxy (e.g., $C_1$-$C_4$ alkoxy such as methoxy, ethoxy, and propoxy), and cyano. Examples of the substituted $C_1$-$C_6$ alkyl include haloalkyl such as trifluoromethyl and 2,2,2-trifluoroethyl, where the haloalkyl corresponds to the alkyl, except with one or more hydrogen atoms constituting the alkyl being substituted by halogen such as fluorine and chlorine; as well as hydroxymethyl, 2-hydroxyethyl, methoxymethyl, 2-methoxyethyl, ethoxymethyl, 2-ethoxyethyl, cyanomethyl, and 2-cyanoethyl.

The halogen as $X^1$ is exemplified by chlorine, bromine, and iodine.

Representative examples of the organometallic compound represented by Formula (1) include organic magnesium compounds (Grignard reagents) such as methylmagnesium bromide, ethylmagnesium bromide, butylmagnesium bromide, methylmagnesium chloride, ethylmagnesium chloride, and butylmagnesium chloride. Representative examples of the organometallic compound represented by Formula (2) include organic lithium compounds such as methyllithium, ethyllithium, n-butyllithium, and t-butyllithium.

Of such organometallic compounds, the organometallic compound represented by Formula (1) is preferred, because the compound can be handled easily, can be safely scaled-up, and is suitable for industrial production.

In Formula (3), $R^2$ represents optionally substituted $C_1$-$C_6$ alkyl; Ring $Z^1$ represents a $C_3$ or $C_4$ alicyclic hydrocarbon ring; $R^3$ is a substituent bonded to Ring $Z^1$ and is, independently in each occurrence, selected from oxo, alkyl, optionally protected hydroxyl, optionally protected hydroxyalkyl, optionally protected carboxy, and cyano; and n represents an integer from 0 to 3. When n is 2 or 3, two or three occurrences of $R^3$ may be identical or different. $R^2$, $R^3$, Ring $Z^1$, and n in Formula (3) respectively correspond to $R^2$, $R^3$, Ring $Z^1$, and n in Formula (a-1).

The $C_1$-$C_6$ alkyl as $R^2$ is exemplified as in $R^1$. Among them, $C_1$-$C_4$ alkyl is preferred, $C_1$-$C_3$ alkyl is particularly preferred, and $C_1$-$C_2$ alkyl is most preferred.

The $C_1$-$C_6$ alkyl as $R^2$ may have one or more substituents. The substituents are exemplified as in $R^1$.

The $C_3$ or $C_4$ alicyclic hydrocarbon ring as Ring $Z^1$ is exemplified by cycloalkane rings such as cyclopropyl and cyclobutyl rings; and cycloalkene rings such as cyclopropene and cyclobutene rings.

$R^3$ represents a substituent bonded to Ring $Z^1$ and is, independently in each occurrence, selected from oxo, alkyl, optionally protected hydroxyl, optionally protected hydroxyalkyl, optionally protected carboxy, and cyano.

The alkyl is exemplified by $C_1$-$C_6$ alkyl such as methyl, ethyl, propyl, isopropyl, butyl, s-butyl, t-butyl, pentyl, isoamyl, s-amyl, t-amyl, and hexyl.

The hydroxyl may be protected by a protecting group. The protecting group is exemplified by $C_1$-$C_4$ alkyl such as methyl, ethyl, and t-butyl; methoxymethyl and other groups that form an acetal bond with oxygen constituting the hydroxyl; acetyl, benzoyl, and other groups that form an ester bond with oxygen constituting the hydroxyl.

The hydroxyalkyl is exemplified by hydroxy-$C_1$-$C_6$ alkyl such as hydroxymethyl, 2-hydroxyethyl, 1-hydroxyethyl, 3-hydroxypropyl, 2-hydroxypropyl, 4-hydroxybutyl, and 6-hydroxyhexyl.

The hydroxyalkyl may be protected by a protecting group. The protecting group is exemplified by $C_1$-$C_4$ alkyl such as methyl, ethyl, and t-butyl; methoxymethyl and other groups that form an acetal bond with oxygen constituting the hydroxyl; acetyl, benzoyl, and other groups that form an ester bond with oxygen constituting the hydroxyl.

The carboxy may be protected by a protecting group. The protecting group is exemplified by $C_1$-$C_6$ alkyl such as methyl, ethyl, propyl, isopropyl, butyl, s-butyl, t-butyl, pentyl, isoamyl, s-amyl, t-amyl, and hexyl; as well as 2-tetrahydrofuranyl, 2-tetrahydropyranyl, and 2-oxepanyl.

Typical examples of the ketone represented by Formula (3) include cyclopropyl methyl ketone, cyclopropyl ethyl ketone, cyclobutyl methyl ketone, and cyclobutyl ethyl ketone.

The tertiary amine is exemplified by aliphatic amines, aromatic amines, alicyclic amines, and heterocyclic amines. The tertiary amine may include, for example, hydroxyl and/or nitro. The tertiary amine may be not only a monoamine, but also a polyamine such as a diamine.

Specific examples of the tertiary amine include aliphatic amines such as trimethylamine, triethylamine, diisopropylethylamine, tri-n-propylamine, triisopropylamine, tributylamine, N-methyl-diethylamine, N-ethyl-dimethylamine, and N-ethyl-diamylamine; aromatic amines such as N,N-dimethylaniline and N,N-diethylaniline; alicyclic amines such as N,N-dimethyl-cyclohexylamine and N,N-diethylcyclohexylamine; heterocyclic amines such as N,N-dimethylaminopyridine, N-methylmorpholine, diazabicycloundecene (DBU), diazabicyclononene (DBN), N-methylpyridine, and N-methylpyrrolidine; and diamines such as tetramethylethylenediamine and triethylenediamine.

Among them, preferred as the tertiary amine are aliphatic amines such as trimethylamine and triethylamine; and heterocyclic amines such as N-methylmorpholine, of which aliphatic amines such as trimethylamine and triethylamine are more preferred, for better yield of the unsaturated carboxylic acid ester.

In Formula (4), R is selected from hydrogen, halogen, and optionally halogenated $C_1$-$C_6$ alkyl; and $X^2$ represents halogen. R in Formula (4) corresponds to R in Formula (a-1).

The halogen as R and $X^2$ is exemplified by chlorine, bromine, and iodine.

The $C_1$-$C_6$ alkyl as R is exemplified by methyl, ethyl, propyl, isopropyl, butyl, isobutyl, s-butyl, t-butyl, pentyl, isoamyl, s-amyl, t-amyl, and hexyl. The halogenated $C_1$-$C_6$ alkyl (haloalkyl) is exemplified by groups such as trifluoromethyl and 2,2,2-trifluoroethyl, where the groups correspond to the alkyl groups, except with one or more hydrogen atoms constituting the alkyl groups being substituted by halogen such as fluorine and chlorine.

Preferred as the unsaturated carboxylic halide represented by Formula (4) are (meth)acryloyl chloride, (meth)acryloyl bromide, and (meth)acryloyl iodide, of which (meth)acryloyl chloride is more preferred for satisfactory availability. As used herein the term "(meth)acryloyl" refers to "acryloyl" and/or "methacryloyl".

The production method employs, as a starting material in the first step, the ketone having excellent reactivity with the organometallic compound and can thereby allow the two compounds to react with each other rapidly to form the tertiary alcohol-organometallic compound adduct, even though the ketone contains a group with a large steric hindrance. After the completion of the first step, the reaction product is subjected to the second step without quenching (namely, without the addition of water and/or an acid) and does not form a tertiary alcohol.

In the second step, the tertiary alcohol-organometallic compound adduct obtained from the first step is allowed to react with the unsaturated carboxylic halide represented by Formula (4) in the presence of the tertiary amine. The unsaturated carboxylic halide is activated by the tertiary amine and, even when being a methacryloyl halide or another carboxylic halide with a large steric hindrance, can rapidly react with the tertiary alcohol-organometallic compound adduct to give the unsaturated carboxylic acid ester represented by Formula (a-1) in a high yield.

First Step

The organometallic compound represented by Formula (1) or (2) may be used in an amount of typically from 0.5 to 2.0 moles, preferably from 0.8 to 1.8 moles, and particularly preferably from 1.1 to 1.4 moles, per 1 mole of the starting material ketone represented by Formula (3). The organometallic compound represented by Formula (1) or (2), if used in an amount less than the range, may tend to cause a lower yield. In contrast, the organometallic compound represented by Formula (1) or (2), if used in an amount greater than the range, may tend to cause deterioration in economic efficiency.

The reaction may be performed in the presence of, or in the absence of, a solvent. The solvent usable herein is exemplified by saturated or unsaturated hydrocarbon solvents such as pentane, hexane, heptane, octane, and petroleum ether; aromatic hydrocarbon solvents such as benzene, toluene, and xylenes; halogenated hydrocarbon solvents such as methylene chloride, chloroform, 1,2-dichloroethane, chlorobenzene, and bromobenzene; ether solvents such as diethyl ether, diisopropyl ether, dibutyl ether, tetrahydrofuran (THF), dioxane, 1,2-dimethoxyethane, and cyclopentyl methyl ether (CPME); sulfolanes such as sulfolane; and high-boiling solvents such as silicone oils. Each of them may be used alone or in combination. Among them, preferred for use in the present invention are ether solvents such as diethyl ether, diisopropyl ether, dibutyl ether, tetrahydrofuran (THF), and cyclopentyl methyl ether (CPME); and halogenated hydrocarbon solvents such as methylene chloride, chloroform, 1,2-dichloroethane, chlorobenzene, and bromobenzene.

The solvent may be used in an amount not critical, as long as being capable of dissolving or dispersing reaction components therein and not adversely affecting factors or properties such as economic efficiency. The solvent may be used in an amount of typically from about 0.1 to about 100 parts by weight, and preferably from 1 to 20 parts by weight, per 1 part by weight of the starting material ketone represented by Formula (3).

The reaction may be performed by adding the ketone represented by Formula (3) dropwise to the organometallic compound represented by Formula (1) or (2), or by adding the organometallic compound represented by Formula (1) or (2) dropwise to the ketone represented by Formula (3). The dropwise addition and reaction aging may be performed at a temperature of typically from −80° C. to the boiling point of the reaction system, preferably from −20° C. to 80° C., and particularly preferably from −5° C. to 50° C. The dropwise addition and the reaction aging may be performed at an identical temperature or different temperatures.

The reaction atmosphere may be appropriately selected within a range not adversely affecting the reaction and may be any atmosphere such as air, oxygen, nitrogen, or argon atmosphere. The reaction may be performed under normal atmospheric pressure or under reduced pressure (typically at about 0.0001 to about 0.1 MPa, and preferably at about 0.001 to about 0.1 MPa). Alternatively, the reaction may be performed under pressure (pressurizing) for an operational reason.

Second Step

The unsaturated carboxylic halide represented by Formula (4) may be used in an amount of typically from about 0.5 to about 20 moles, preferably from 0.8 to 8 moles, and particularly preferably from 1 to 3 moles, per 1 mole of the starting material ketone represented by Formula (3). The unsaturated carboxylic halide represented by Formula (4), if used in an amount less than the range, may tend to cause a lower reaction rate. In contrast, the unsaturated carboxylic halide represented by Formula (4), if used in an amount greater than the range, may fail to contribute to better reaction result and may tend to cause inferior economic efficiency.

The tertiary amine may be used in an amount of typically from about 0.5 to about 20 moles, preferably from 0.8 to 8 moles, and particularly preferably from 1 to 3 moles, per 1 mole of the starting material ketone represented by Formula (3). With respect to the unsaturated carboxylic halide, the tertiary amine may be used in an amount of typically from about 0.5 to about 10 moles, preferably from 0.8 to 5 moles, and particularly preferably from 1 to 3 moles, per 1 mole of the unsaturated carboxylic halide. The tertiary amine, if used in an amount less than the range, may tend to cause a lower yield. In contrast, the tertiary amine, if used in an amount greater than the range, may tend to cause inferior economic efficiency.

A polymerization inhibitor is preferably present in the system upon the reaction and separation/purification. The polymerization inhibitor, when present, inhibits the starting material unsaturated carboxylic halide represented by Formula (4) and the target unsaturated carboxylic acid ester represented by Formula (a-1) from being polymerized separately or being copolymerized with each other, where such polymerization or copolymerization will give oligomers. Thus, the resulting acid unsaturated carboxylic acid ester can have a very low content of such oligomers as impurities.

The polymerization inhibitor is exemplified by 4,4'-thiobis (6-t-butyl-m-cresol), 4,4'-butylidenebis(6-t-butyl-m-cresol), 1,1,3-tris(5-t-butyl-4-hydroxy-2-methylphenyl)butane, p-methoxyphenol, and phenothiazine. In addition or alternatively, a component containing molecular oxygen may coexist with the reaction system to suppress the polymerization reaction. Such component is exemplified by air; and air diluted typically with nitrogen. Each of them may be used alone or in combination.

The polymerization inhibitor may be used in an amount of typically from about 0.0001 to about 5 parts by weight, and preferably from 0.005 to 0.3 parts by weight, per 100 parts by weight of the ketone represented by Formula (3).

The reaction may be performed in the presence of, or in the absence of, a solvent. The solvent usable herein is exemplified by ester solvents such as ethyl acetate and butyl acetate; saturated or unsaturated hydrocarbon solvents such as pentane, hexane, heptane, octane, and petroleum ether; aromatic hydrocarbon solvents such as benzene, toluene, and xylenes; halogenated hydrocarbon solvents such as methylene chloride, chloroform, 1,2-dichloroethane, chlorobenzene, and bromobenzene; ether solvents such as diethyl ether, diisopropyl ether, dibutyl ether, tetrahydrofuran (THF), dioxane, 1,2-dimethoxyethane, and cyclopentyl methyl ether (CPME); nitriles such as acetonitrile and benzonitrile; sulfoxide solvents such as dimethyl sulfoxide; sulfolanes such as sulfolane; amide solvents such as dimethylformamide; and high-boiling solvents such as silicone oils. Each of them may be used alone or in combination. Alternatively, the tertiary amine may be allowed to act also as a solvent. Among them, preferred for use in the present invention are ester solvents such as ethyl acetate and butyl acetate; ether solvents such as diethyl ether, diisopropyl ether, dibutyl ether, tetrahydrofuran (THF), dioxane, 1,2-dimethoxyethane, and cyclopentyl methyl ether (CPME); nitriles such as acetonitrile and benzonitrile; and halogenated hydrocarbon solvents such as methylene chloride, chloroform, 1,2-dichloroethane, chlorobenzene, and bromobenzene.

The solvent may be used in an amount not critical, as long as being capable of dissolving or dispersing reaction components therein and not adversely affecting the economic efficiency, and may be used in an amount of typically from about 0.5 to about 100 parts by weight, and preferably from 1 to 20 parts by weight, per 1 part by weight of the unsaturated carboxylic halide represented by Formula (4).

The solvent to be used in the second step may be identical to, or different from, the solvent in the first step. Assume that the solvent for use in the second step is identical to the solvent in the first step. In this case, after the completion of the first step, the solvent used in the first step may be subjected to the second step as intact, or after adjustment of its concentration by concentration or dilution.

The reaction temperature is typically from about −50° C. to about 150° C. The lower limit thereof is preferably −10° C., particularly preferably 0° C., and most preferably 10° C. The upper limit thereof is preferably 80° C., more preferably 50° C., particularly preferably 45° C., most preferably 40° C., and still more preferably lower than 40° C.

The reaction atmosphere may be selected as appropriate within a range not adversely affecting the reaction and can be any atmosphere such as air, nitrogen, or argon atmosphere. The reaction may be performed under normal atmospheric pressure or under reduced pressure (typically at about 0.0001 to about 0.1 MPa, and preferably at about 0.001 to about 0.1 MPa). Alternatively, the reaction may be performed under pressure (pressurizing) for an operational reason.

The reaction may be performed typically by a process of adding the tertiary amine to the addition reaction product obtained from the first step, and thereafter sequentially adding the unsaturated carboxylic halide represented by Formula (4) (or a solution containing the halide) into the reaction system. The polymerization inhibitor, when to be added, may be added into the reaction system at an appropriate timing before the addition of the unsaturated carboxylic halide represented by Formula (4). The reaction may be performed according to a common system or procedure such as batch system, semi-batch system, or continuous system.

After the reaction, the target unsaturated carboxylic acid ester represented by Formula (a-1) may be used as intact, or after separation/purification. The separation/purification may be performed by a common separation/purification process such as extraction, washing (e.g., washing with an acid, an alkali, or water), distillation, rectification, molecular distillation, and/or adsorption. The separation/purification may be performed continuously or discontinuously (batchwise). Such separation/purification operation may be performed under reduced pressure or under normal atmospheric pressure.

In an especially preferred embodiment of the present invention, the production method may further include the step of extracting (separating as a liquid) a reaction product using water and an organic solvent, where the step is performed after the reaction. The organic solvent is exemplified by aliphatic hydrocarbon solvents such as hexane and heptane; alicyclic hydrocarbon solvents such as cyclohexane, methylcyclohexane, and cyclopentane; aromatic hydrocarbon solvents such as toluene and xylenes; ester solvents such as ethyl acetate and butyl acetate; and halogenated hydrocarbon solvents such as methylene chloride and chloroform. Among them, preferred for use in the present invention are alicyclic hydrocarbon solvents such as cyclohexane and methylcyclohexane; and ester solvents such as ethyl acetate and butyl acetate. These solvents are preferred for obtaining the unsaturated carboxylic acid ester represented by Formula (a-1) with high purity in a high recovery rate.

The method for producing an unsaturated carboxylic acid ester can give an unsaturated carboxylic acid ester in a satisfactory yield (e.g., 50% or more, and preferably 60% or more) with a high purity (of typically 75% or more, preferably 80% or more, and particularly preferably 90% or more).

Among such unsaturated carboxylic acid esters represented by Formula (a-1), especially preferred in the present invention are compounds represented by Formulae (a-1-1) to (a-1-6):

[Chem. 8]

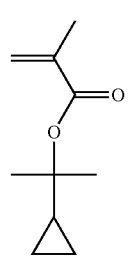

(a-1-1)

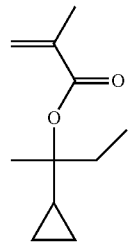

(a-1-2)

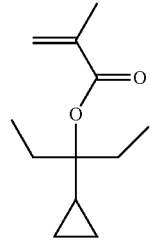

(a-1-3)

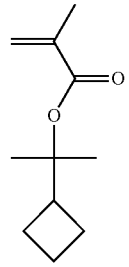

(a-1-4)

-continued (a-1-5)
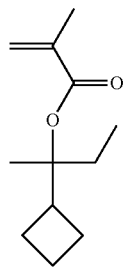

(a-1-6)
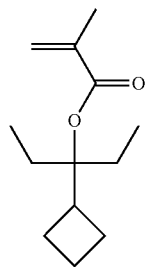

Monomer Unit (b)

The monomer unit (b) for use in the present invention is a monomer unit including an alicyclic skeleton containing a polar group and functions so as to impart substrate adhesion (adhesion to a substrate) and etch resistance to the polymer compound.

The polar group is exemplified by —O—, —C(=O)—, —C(=O)—O—, —O—C(=O)—O—, —C(=O)—O—C(=O)—, —C(=O)—NH—, —S(=O)—O—, —S(=O)$_2$—O—, —OR$^a$, —C(=O)—OR$^a$, and —CN. The alicyclic skeleton may contain each of these polar groups alone or in combination.

R$^a$ represents, independently in each occurrence, optionally substituted alkyl. The alkyl is exemplified by $C_1$-$C_6$ alkyl such as methyl, ethyl, propyl, isopropyl, butyl, s-butyl, t-butyl, pentyl, isoamyl, s-amyl, t-amyl, and n-hexyl.

The alkyl as R$^a$ may have one or more substituents. The substituents are exemplified by halogen such as fluorine, chlorine, and bromine; $C_1$-$C_5$ haloalkyl such as trifluoromethyl; hydroxyl; $C_1$-$C_4$ alkoxy such as methoxy; amino; di-($C_1$-$C_4$ alkyl)amino; carboxy; $C_1$-$C_4$ alkoxy-carbonyl such as methoxycarbonyl; nitro; cyano; and $C_1$-$C_6$ aliphatic acyl such as acetyl.

The monomer unit (b) in the present invention preferably includes at least one monomer unit selected from monomer units (b1) to (b6) respectively represented by Formulae (b1) to (b6). In the formulae, R is, independently in each occurrence, selected from hydrogen, halogen, and optionally halogenated $C_1$-$C_6$ alkyl. A is, independently in each occurrence, selected from a single bond and a linkage group. X is, independently in each occurrence, selected from non-bond, methylene, ethylene, oxygen, and sulfur. Y is selected from methylene and carbonyl. R$^4$ to R$^8$ are each, identically or differently, selected from hydrogen, alkyl, optionally protected hydroxyl, optionally protected hydroxyalkyl, optionally protected carboxy, and cyano. R$^9$ is, independently in each occurrence, selected from optionally protected hydroxyl, optionally protected hydroxyalkyl, optionally protected carboxy, and cyano. Ring Z$^2$ represents a $C_6$-$C_{20}$ alicyclic hydrocarbon ring. A repetition number m represents an integer from 1 to 5.

[Chem. 9]

(b1)
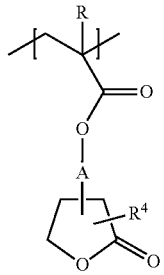

(b2)
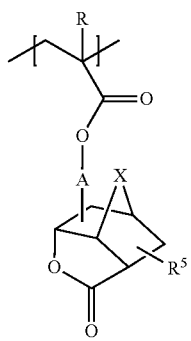

(b3)
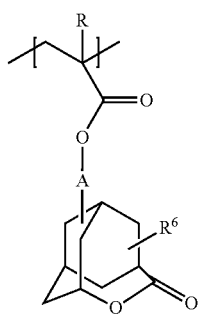

(b4)
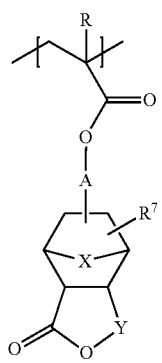

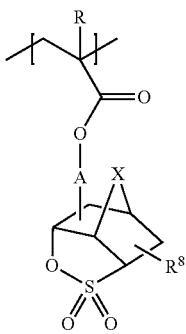

(b5)

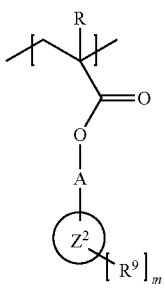

(b6)

R is selected from hydrogen, halogen, and optionally halogenated $C_1$-$C_6$ alkyl, and is exemplified as in R in Formula (4).

The linkage group as A is exemplified by alkylene, carbonyl (—C(=O)—), ether bond (—O—), ester bond (—C(=O)—O—), amide bond (—C(=O)—NH—), carbonate bond (—O—C(=O)—O—), and groups each including two or more of them linked to each other. The alkylene is exemplified by linear or branched chain alkylene such as methylene, methylmethylene, dimethylmethylene, ethylene, propylene, and trimethylene; and divalent alicyclic hydrocarbon groups such as 1,2-cyclopentylene, 1,3-cyclopentylene, cyclopentylidene, 1,2-cyclohexylene, 1,3-cyclohexylene, 1,4-cyclohexylene, and cyclohexylidene groups, of which divalent cycloalkylene groups are preferred.

The alkyl as $R^4$ to $R^8$ is exemplified as in $R^3$ in Formula (3).

The optionally protected hydroxyl, optionally protected hydroxyalkyl, optionally protected carboxy as $R^4$ to $R^9$ is exemplified as in $R^3$ in Formula (3).

Ring $Z^2$ represents a $C_6$-$C_{20}$ alicyclic hydrocarbon ring. The $C_6$-$C_{20}$ alicyclic hydrocarbon ring is exemplified by monocyclic alicyclic carbon rings including cycloalkane rings containing about 6 to about 20 members, such as cyclohexane and cyclooctane rings, of which those containing 6 to 15 members are preferred, and those containing 6 to 12 members are particularly preferred, and cycloalkene rings containing about 6 to about 20 members, such as cyclohexene ring, of which those containing 6 to 15 members are preferred, and those containing 6 to 10 members are particularly preferred; adamantane ring, rings each including a norbornene or norbornene ring, such as norbornane, norbornene, bornane, isobornane, tricyclo[5.2.1.0$^{2,6}$]decane, and tetracyclo[4.4.0.1$^{2,5}$.1$^{7,10}$]dodecane rings; hydrogenated rings derived from polycyclic aromatic fused rings, such as perhydroindene, decahydronaphthalene (perhydronaphthalene), perhydrofluorene (tricyclo[7.4.0.0$^{3,8}$]tridecane), and perhydroanthracene rings, of which those fully hydrogenated are preferred; and bridged carbon rings each containing about two to about six rings, such as tricyclo[4.2.2.1$^{2,5}$]undecane ring and other bicyclic, tricyclic, or tetracyclic bridged carbon rings (e.g., bridged carbon rings containing about 6 to about 20 carbon atoms).

Of such monomer units (b), the monomer units represented by Formulae (b1), (b2), (b3), (b4), and (b5) each include "—C(=O)—O—" or "—S(=O)$_2$—O—", are thereby highly hydrophile, and can functionally impart excellent substrate adhesion to the polymer compound. The monomer unit represented by Formula (b6) can impart high transparency and satisfactory etch resistance to the polymer compound. For these reasons, the polymer compound according to the present invention preferably includes, as the monomer unit (b) in combination with the monomer unit (a), both the monomer unit represented by Formula (b6) and at least one selected from the group consisting of the monomer units represented by Formulae (b1), (b2), (b3), (b4), and (b5). The resulting polymer compound can have substrate adhesion, etch resistance, and transparency all at satisfactory levels.

The polymer compound according to the present invention may have a ratio (molar ratio) of typically 1 or more, preferably 2 or more, and particularly preferably 3 or more, where the ratio is of the content (total content when two or more are employed) of at least one selected from the monomer units represented by Formula (b1), (b2), (b3), (b4), and (b5) to the content of the monomer unit represented by Formula (b6).

The monomer unit (b) in the present invention is exemplified by monomer units represented by formulae indicated below. The monomer unit (b) may be introduced into the polymer compound by subjecting a corresponding polymerizable monomer to polymerization.

[Chem. 10]

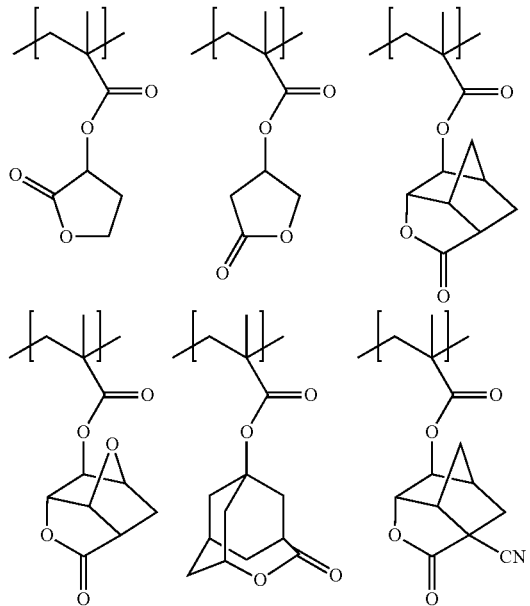

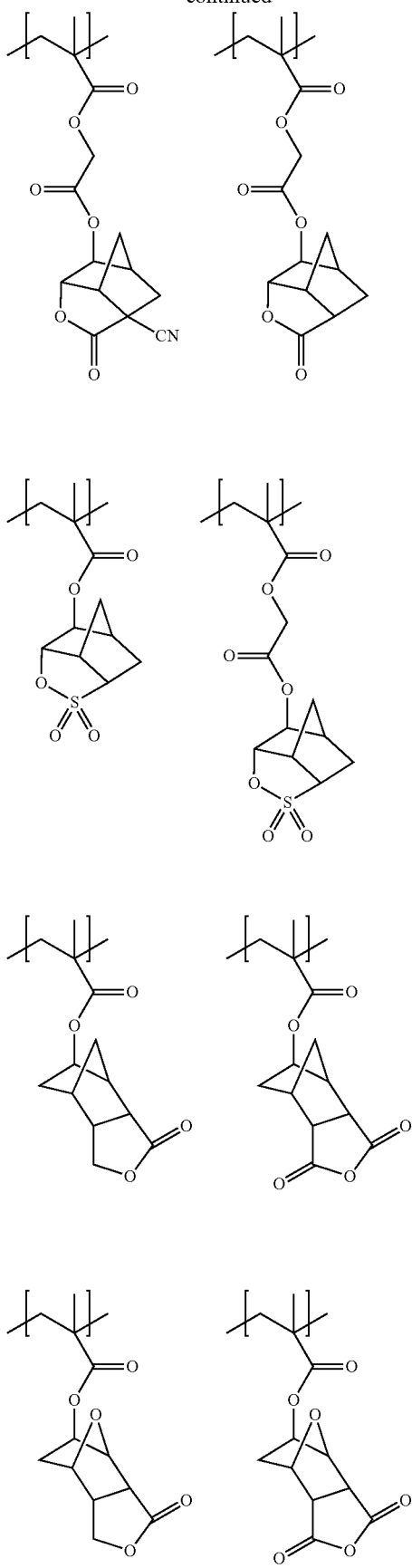

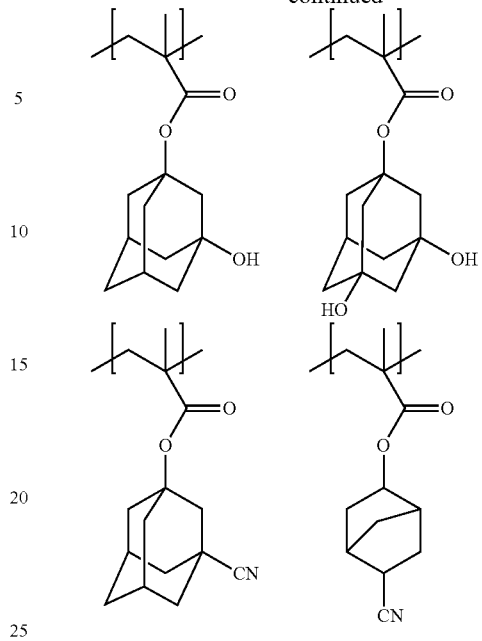

Monomer Unit (c)

The monomer unit (c) for use in the present invention is at least one monomer unit selected from monomer units (c1) to (c4) respectively represented by Formulae (c1) to (c4) indicated below, except for those included in the monomer units (b). The monomer unit (c) rapidly releases its acid-leaving group (protecting group typically for carboxy group) by the action of an acid to form a carboxy group that contributes to development of solubility in an alkali. The monomer unit (c) herein imparts, to the polymer compound, etch resistance and a property of becoming alkali-soluble by the action of an acid.

In Formulae (c1) to (c4), R is, independently in each occurrence, selected from hydrogen, halogen, and optionally halogenated $C_1$-$C_6$ alkyl. $R^{10}$, $R^{11}$, and $R^{12}$ each represent, identically or differently, optionally substituted $C_1$-$C_6$ alkyl. $R^{13}$ and $R^{14}$ are each, identically or differently, selected from hydrogen and optionally substituted $C_1$-$C_6$ alkyl. $R^{15}$ represents, independently in each occurrence, —COOR$^d$, where R$^d$ is selected from an optionally substituted tertiary hydrocarbon group, tetrahydrofuranyl, tetrahydropyranyl, and oxepanyl. The number p represents an integer from 1 to 3. R$^c$ is a substituent bonded to Ring $Z^3$ and is, identically or differently in each occurrence, selected from oxo, alkyl, optionally protected hydroxyl, optionally protected hydroxyalkyl, and optionally protected carboxy. The number q represents, independently in each occurrence, an integer from 0 to 3. Ring $Z^3$ represents, independently in each occurrence, a $C_5$-$C_{20}$ alicyclic hydrocarbon ring.

[Chem. 11]

(c1)

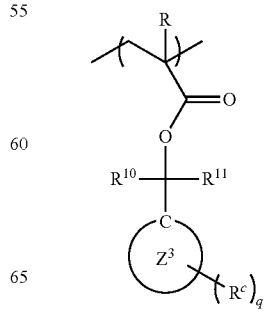

(c2)

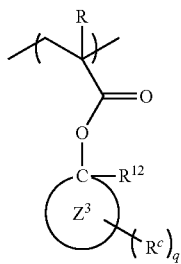

(c3)

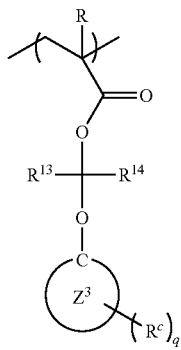

(c4)

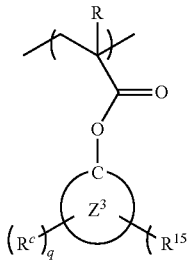

R is, independently in each occurrence, selected from hydrogen, halogen, and optionally halogenated $C_1$-$C_6$ alkyl, and is exemplified as in R in Formula (4).

The $C_1$-$C_6$ alkyl as $R^{10}$ to $R^{14}$ is exemplified as in $R^1$. Among them, preferred is $C_1$-$C_4$ alkyl, of which $C_1$-$C_3$ alkyl is particularly preferred, and $C_1$ or $C_2$ alkyl is most preferred.

The $C_1$-$C_6$ alkyl as $R^{10}$ to $R^{14}$ may have one or more substituents. The substituents are exemplified as in $R^1$.

The tertiary hydrocarbon group as $R^d$ is exemplified by t-butyl and t-pentyl.

The tertiary hydrocarbon group as $R^d$ may have one or more substituents. The substituents are exemplified by halogen, hydroxy, substituted hydroxy (e.g., $C_1$-$C_4$ alkoxy such as methoxy, ethoxy, and propoxy), and cyano.

The alkyl, optionally protected hydroxyl, optionally protected hydroxyalkyl, and optionally protected carboxy as $R^c$ are exemplified as in $R^3$ in Formula (3).

The $C_5$-$C_{20}$ alicyclic hydrocarbon ring as Ring $Z^3$ is exemplified by monocyclic alicyclic carbon rings including cycloalkane rings containing about 5 to about 20 members, such as cyclopentane, cyclohexane, and cyclooctane rings, of which those containing 5 to 15 members are preferred, and those containing 5 to 12 members are particularly preferred, and cycloalkene rings containing about 5 to about 20 members, such as cyclopentene and cyclohexene rings, of which those containing 5 to 15 members are preferred, and those containing 5 to 10 members are particularly preferred; adamantane ring; rings each including a norbornane or norbornene ring, such as norbornane, norbornene, bornane, isobornane, tricyclo[5.2.1.0$^{2,6}$]decane, and tetracyclo [4.4.0.1$^{2,5}$.1$^{7,10}$]dodecane rings; hydrogenated rings derived from polycyclic aromatic fused rings, such as perhydroindene, decahydronaphthalene (perhydronaphthalene), perhydrofluorene (tricyclo[7.4.0.0$^{3,8}$]tridecane), and perhydroanthracene rings, of which fully hydrogenated rings are preferred; and bridged carbon rings each containing about two to about six rings, such as tricyclo[4.2.2.1$^{2,5}$]undecane ring and other bicyclic, tricyclic, or tetracyclic bridged carbon rings (e.g., bridged carbon rings containing about 6 to about 20 carbon atoms).

Exemplary unsaturated carboxylic acid esters corresponding to the monomer unit (c) include compounds represented by formulae below. The monomer unit (c) can be introduced into the polymer compound by subjecting such a corresponding unsaturated carboxylic acid ester to polymerization.

[Chem. 12]

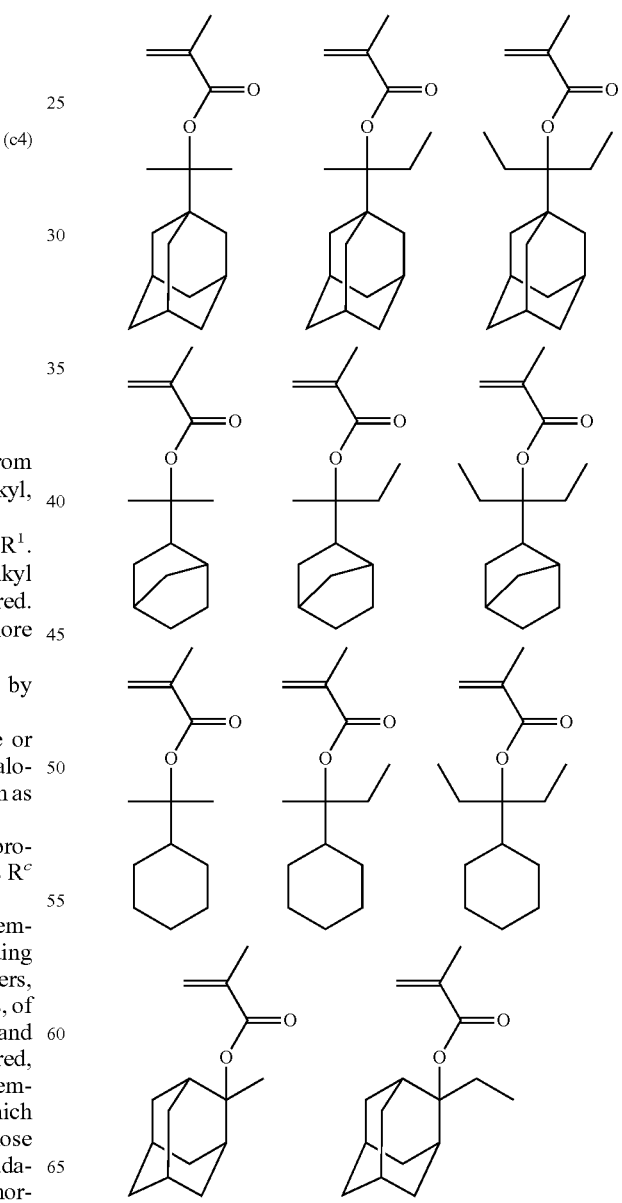

-continued

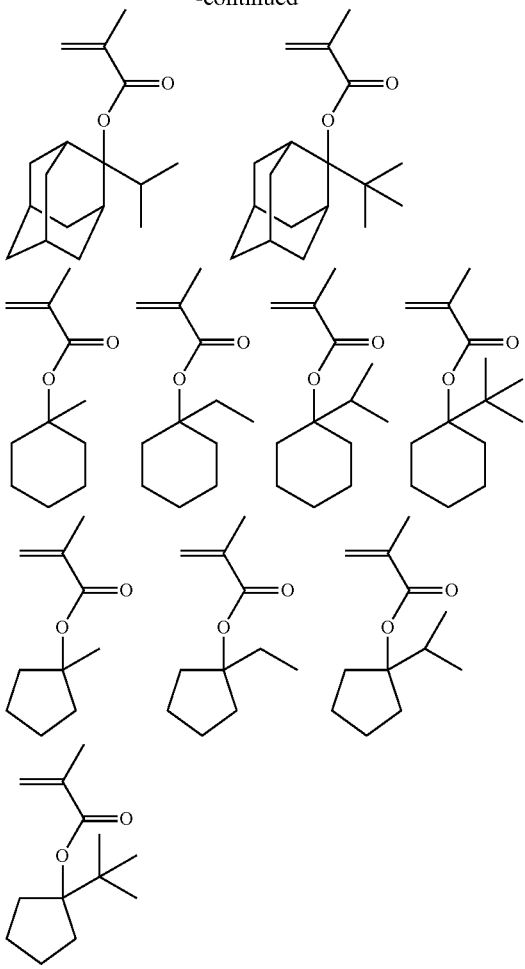

A monomer mixture may be used to form the polymer compound according to the present invention, where the monomer mixture includes the unsaturated carboxylic acid ester represented by Formula (a-1), a polymerizable monomer corresponding to the monomer unit (b), and, as needed, a polymerizable monomer corresponding to the monomer unit (c). The polymerization of the monomer mixture may be performed by any of common processes to produce acrylic polymers, such as solution polymerization, bulk polymerization, suspension polymerization, bulk-suspension polymerization, and emulsion polymerization, of which solution polymerization is preferred. Of such solution polymerization techniques, dropping polymerization is particularly preferred. Specifically, the dropping polymerization may be performed by a process such as the processes (i) to (iv) as follows. In the process (i), monomers are dissolved in an organic solvent to give a monomer solution, separately, a polymerization initiator is dissolved in the organic solvent to give a polymerization initiator solution, and the previously prepared monomer solution and polymerization initiator solution are independently added dropwise to another portion of the organic solvent held at a constant temperature. In the process (ii), the monomers and the polymerization initiator are together dissolved in an organic solvent to give a mixture solution, and the mixture solution is added dropwise to another portion of the organic solvent held at a constant temperature. In the process (iii), the monomers are dissolved in an organic solvent to give a monomer solution, the polymerization initiator is separately dissolved in the organic solvent to give a polymerization initiator solution, and the prepared polymerization initiator solution is added dropwise to the monomer solution held at a constant temperature. In the process (iv), part of the monomers is dissolved in an organic solvent to give a monomer solution 1, the remainder of the monomers is dissolved in another portion of the organic solvent to give a monomer solution 2, the polymerization initiator is dissolved in yet another portion of the organic solvent to give a polymerization initiator solution, and the monomer solution 2 and the polymerization initiator solution are added dropwise to the monomer solution 1 held at a constant temperature.

The polymerization solvent may be any of common solvents and is exemplified by ethers, esters, ketones, amides, sulfoxides, alcohols, hydrocarbons, and mixtures of them. The ethers are exemplified by chain ethers including glycol ethers, such as diethyl ether and propylene glycol monomethyl ether; and cyclic ethers such as tetrahydrofuran and dioxane. The esters are exemplified by chain esters such as methyl acetate, ethyl acetate, butyl acetate, and ethyl lactate; and glycol ether esters such as propylene glycol monomethyl ether acetate. The ketones are exemplified by acetone, methyl ethyl ketone, methyl isobutyl ketone, and cyclohexanone. The amides are exemplified by N,N-dimethylacetamide and N,N-dimethylformamide. The sulfoxides are exemplified by dimethyl sulfoxide. The alcohols are exemplified by methanol, ethanol, and propanol. The hydrocarbons are exemplified by aromatic hydrocarbons such as benzene, toluene, and xylenes; aliphatic hydrocarbons such as hexane; and alicyclic hydrocarbons such as cyclohexane. The polymerization initiator usable herein may be selected from common polymerization initiators. The polymerization may be performed at a temperature of typically from about 30° C. to about 150° C., preferably from 50° C. to 120° C., and particularly preferably from 60° C. to 100° C.

The polymer compound obtained by the polymerization may be purified by precipitation or reprecipitation. A solvent for the precipitation or reprecipitation may be any of organic solvents and water and may be a solvent mixture of two or more different organic solvents, or a solvent mixture of water and one or more organic solvents. Such organic solvents for use as solvents for precipitation or reprecipitation are exemplified by hydrocarbons, halogenated hydrocarbons, nitro compounds, nitriles, ethers, ketones, esters, carbonates, alcohols, carboxylic acids, and solvent mixtures of them. The hydrocarbons are exemplified by aliphatic hydrocarbons such as pentane, hexane, heptane, and octane; alicyclic hydrocarbons such as cyclohexane and methylcyclohexane; and aromatic hydrocarbons such as benzene, toluene, and xylenes. The halogenated hydrocarbons are exemplified by aliphatic halogenated hydrocarbons such as methylene chloride, chloroform, and carbon tetrachloride; and aromatic halogenated hydrocarbons such as chlorobenzene and dichlorobenzene. The nitro compounds are exemplified by nitromethane and nitroethane. The nitriles are exemplified by acetonitrile and benzonitrile. The ethers are exemplified by chain ethers such as diethyl ether, diisopropyl ether, and dimethoxyethane; and cyclic ethers such as tetrahydrofuran and dioxane. The ketones are exemplified by acetone, methyl ethyl ketone, and diisobutyl ketone. The esters are exemplified by ethyl acetate and butyl acetate. The carbonates are exemplified by dimethyl carbonate, diethyl carbonate, ethylene carbonate, and propylene carbonate. The alcohols are exemplified by methanol, ethanol, propanol, isopropyl alcohol, and butanol. The carboxylic acids are exemplified by acetic acid.

Among such organic solvents for use as the precipitation or reprecipitation solvent, preferred is a solvent containing at least a hydrocarbon (of which an aliphatic hydrocarbon such as hexane is more preferred). The solvent containing a hydrocarbon may have a ratio (by weight) of the hydrocarbon (e.g., an aliphatic hydrocarbon such as hexane) to one or more other solvents is typically from about 10:90 to about 99:1, preferably from 30:70 to 98:2, and particularly preferably from 50:50 to 97:3.

In an embodiment, the polymer compound according to the present invention does not include the monomer unit (c). In this embodiment, the polymer compound may include the monomer unit (a) in a content of typically from about 5 to about 99 mole percent, preferably from 10 to 90 mole percent, and particularly preferably from 30 to 80 mole percent, based on the total amount of monomer units constituting the polymer. This polymer compound may include the monomer unit (b) in a content of typically from about 1 to about 95 mole percent, preferably from 10 to 90 mole percent, and particularly preferably from 20 to 70 mole percent, based on the total amount of monomer units constituting the polymer.

In another embodiment, the polymer compound according to the present invention includes the monomer unit (c). In this embodiment, the polymer compound may include the monomer unit (a) in a content of typically from about 5 to about 95 mole percent, preferably from 10 to 80 mole percent, particularly preferably from 20 to 70 mole percent, and most preferably from 20 to 50 mole percent, based on the total amount of monomer units constituting the polymer. This polymer compound may include the monomer unit (b) in a content of typically from about 1 to about 90 mole percent, preferably from 10 to 80 mole percent, particularly preferably from 20 to 70 mole percent, and most preferably from 30 to 60 mole percent, based on the total amount of monomer units constituting the polymer. The polymer compound may include the monomer unit (c) in a content of typically from about 5 to about 90 mole percent, preferably from 5 to 70 mole percent, particularly preferably from 5 to 50 mole percent, and most preferably from 5 to 40 mole percent, based on the total amount of monomer units constituting the polymer.

The polymer compound according to the present invention may have a weight-average molecular weight (Mw) of typically from about 1000 to about 50000, preferably from 3000 to 20000, and particularly preferably from 4000 to 15000 and may have a molecular weight distribution (Mw/Mn) of typically from about 1.0 to about 3.0, and preferably from 1.0 to 2.5, where the molecular weight distribution is the ratio Mw/Mn of the weight-average molecular weight (Mw) to a number-average molecular weight (Mn). The term "Mn" refers to a number-average molecular weight. Both the Mn and Mw are values calibrated with a polystyrene standard.

Photoresist Resin Composition

The photoresist resin composition according to the present invention includes the polymer compound, a photoacid generator, and an organic solvent.

The photoacid generator may be any of common compounds that efficiently form an acid upon exposure. Such compounds are exemplified by diazonium salts; iodonium salts such as diphenyliodo hexafluorophosphate; sulfonium salts such as triphenylsulfonium hexafluoroantimonate, triphenylsulfonium hexafluorophosphate, and triphenylsulfonium methanesulfonate; sulfonic acid esters such as 1-phenyl-1-(4-methylphenyl)sulfonyloxy-1-benzoylmethane, 1,2,3-trisulfonyloxymethylbenzene, 1,3-dinitro-2-(4-phenylsulfonyloxymethyl)benzene, and 1-phenyl-1-(4-methylphenylsulfonyloxymethyl)-1-hydroxy-1-benzoylmethane; oxathiazole derivatives; s-triazine derivatives; disulfone derivatives such as diphenyl disulfone; imide compounds; oxime sulfonates; diazonaphthoquinone; and benzoin tosylate. Each of them may be used alone or in combination.

The photoacid generator may be used in a content selected as appropriate depending on strength of the acid formed upon light irradiation and proportions or ratios among individual monomer units (repeating units) in the polymer compound. The photoacid generator may be used in a content of typically from about 0.1 to about 30 parts by weight, preferably from 1 to 25 parts by weight, and particularly preferably from 2 to 20 parts by weight, per 100 parts by weight of the polymer compound.

The organic solvent is exemplified by ethers, esters, and ketones. The ethers are exemplified by chain ethers including glycol ethers such as propylene glycol monomethyl ether; and cyclic ethers such as dioxane. The esters are exemplified by chain esters such as methyl acetate, ethyl acetate, butyl acetate, and ethyl lactate; cyclic esters such as γ-butyrolactone; glycol ether esters such as propylene glycol monomethyl ether acetate. The ketones are exemplified by methyl ethyl ketone, methyl isobutyl ketone, and cyclohexanone. Each of them may be used alone or in combination. Among them, preferred in the present invention is an organic solvent including at least one selected typically from propylene glycol monomethyl ether acetate, propylene glycol monomethyl ether, ethyl lactate, γ-butyrolactone, and cyclohexanone.

The organic solvent may be used in a content selected as appropriate depending typically on the thickness of a resist film to be formed and may be used in a content within such a range that the content (concentration) of the polymer compound be typically from about 1 to about 20 percent by weight, preferably from 2 to 15 percent by weight, and particularly preferably from 3 to 10 percent by weight.

The photoresist resin composition according to the present invention may further include one or more other components in addition to the polymer compound, the photoacid generator, and the organic solvent. Such other components are exemplified by basic compounds to improve post-exposure temporal stability between an exposing step and a post-exposure heating step, such as triethylamine, 1,8-diazabicyclo[5.4.0]-7-undecene (DBU), and 1,5-diazabicyclo[4.3.0]-5-nonene (DBN); additive resins for improving resist performance; surfactants for improving coatability upon film formation; dissolution inhibitors for controlling solubility upon development; stabilizers; plasticizers; photosensitizers; and light absorbers.

Semiconductor Structure Production Method

The method for producing a semiconductor structure according to the present invention includes forming a pattern using the photoresist resin composition. The method may be performed by applying the photoresist resin composition onto a base or substrate, drying the applied resin composition to form a coating (resist film), exposing the coating to light through a predetermined mask (or further performing post-exposure bake) to form a pattern as a latent image, and developing the latent image.

The base or substrate is exemplified by silicon wafers, metals, plastics, glass, and ceramics. The application of the photoresist resin composition may be performed with a common coating device such as a spin coater, dip coater, or roller coater. The coating may have a thickness of typically from about 0.01 to about 1 μm, and preferably from 0.03 to 0.5 μm.

The exposure may employ luminous rays with various wavelengths, such as ultraviolet rays and X-rays. In particular, when the resin composition is used for a semiconductor resist, the exposure generally employs g line; i line; and excimer laser beams such as XeCl, KrF, KrCl, ArF, ArCl, F$_2$, Kr$_2$, KrAr, and Ar$_2$ excimer laser beams.

In the method for producing a semiconductor structure according to the present invention, the photoacid generator generates an acid upon light irradiation. The acid acts to allow the monomer unit (a) (or both the monomer unit (a) and the monomer unit (c) when the monomer unit (c) is also included) of the polymer compound to rapidly release the acid-leaving group (protecting group for carboxy group) thereof and to form a carboxy group that helps the polymer compound to become soluble. The resulting compound (moiety) left from the monomer unit (a) by the action of the acid exhibits alkali solubility and can be washed away with an alkaline developer. This suppresses the formation of scum on the substrate surface. Accordingly, the method can precisely give a fine pattern by development with water or an alkaline developer.

EXAMPLES

The present invention will be illustrated in further detail with reference to several examples below. It should be noted, however, that the examples are by no means intended to limit the scope of the invention.

The weight-average molecular weight (Mw) and number-average molecular weight (Mn) of each polymer was determined by gel permeation chromatograph (GPC) measurement using tetrahydrofuran as a solvent. A polystyrene was used as a reference standard, and a refractive index detector (RI detector) was used as a detector. The GPC measurement was performed using three columns "KF-806L" (supplied by Showa Denko K.K.) coupled in series, at a column temperature of 40° C., a RI detector temperature of 40° C., and a tetrahydrofuran flow rate of 0.8 mL/min. The dispersity (Mw/Mn) was calculated from the measured values.

Preparation Example 1

Production of 1-(1-methacryloyloxy-1-methylethyl)cyclopropane

A 50-mL four-neck flask was equipped with a reflux condenser, a dropping funnel, and a thermometer. A methylmagnesium chloride solution in THF (1.75 M) in an amount of 88.3 g (0.15 mol in terms of methylmagnesium chloride) was placed in the flask, and the reaction system was stirred in a nitrogen atmosphere.

To this, 10 g (0.12 mol) of cyclopropyl methyl ketone was added dropwise over about one hour while keeping the reactor internal temperature at 20° C. to 25° C. After the completion of dropwise addition, the system was stirred for 4 hours while keeping the reactor internal temperature at 20° C. to 30° C.

The resulting reaction mixture was split to give a 19.2 g (corresponding to 0.024 mol of the ketone) aliquot, and the aliquot was combined with 8.0 g of ethyl acetate, 0.005 g of p-methoxyphenol, and 0.015 g of phenothiazine. This was combined with 3.8 g (0.037 mol) of triethylamine, and further combined with 3.2 g (0.026 mol) of methacryloyl chloride added dropwise over 10 minutes with stirring in a nitrogen atmosphere while keeping the reactor internal temperature at 15° C. to 20° C. The mixture was further continuously stirred for 5 hours, followed by reaction completion.

After the completion of reaction, the reaction system was treated with an acid and analyzed to find (detect) that the reaction system included 86% of target 1-(1-methacryloyloxy-1-methylethyl)cyclopropane, with principal by-products such as 4% of 1-methyl-1-cyclopropylethanol and 9% of methacrylic acid as compounds derived from the starting materials.

Example 1

Production of Polymer Compound Represented by Formula Given Below

In a nitrogen atmosphere, 35.7 g of cyclohexanone were placed in a round-bottomed flask equipped with a reflux condenser, a stirring bar, a three-way stopcock, and a thermometer, and, with stirring while keeping the temperature at 80° C., combined with a monomer solution added dropwise at a constant rate over 6 hours. The monomer solution had been prepared by mixing 13.56 g (61.1 mmol) of 5-methacryloyloxy-3-oxatricyclo[4.2.1.0$^{4,8}$]nonan-2-one, 3.60 g (15.3 mmol) of 1-hydroxy-3-methacryloyloxyadamantane, 12.83 g (76.4 mmol) of 1-(1-methacryloyloxy-1-methylethyl)cyclopropane, 1.80 g of dimethyl 2,2'-azobisisobutyrate (trade name V-601, supplied by Wako Pure Chemical Industries, Ltd.), and 66.3 g of cyclohexanone. After the completion of dropwise addition, the mixture was further stirred for 2 hours. After the completion of polymerization reaction, the resulting reaction mixture was filtrated through a filter having a pore size of 0.1 μm and added dropwise to seven times the amount of a 9:1 (by weight) mixture of hexane and ethyl acetate to give precipitates. The precipitates were collected by filtration, dried, and yielded 27.3 g of the desired polymer compound. The recovered polymer compound was analyzed by GPC and found to have a weight-average molecular weight (Mw) of 9300 and a dispersity (Mw/Mn) of 1.91.

[Chem. 13]

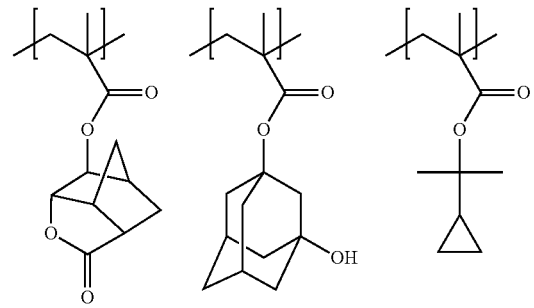

Example 2

Production of Polymer Compound Represented by Formula Given Below

The procedure of Example 1 was performed, except for using monomer components as follows, and yielded 27.0 g of the desired polymer compound. The monomer components were 10.45 g (47.1 mmol) of 5-methacryloyloxy-3-oxatricyclo[4.2.1.0$^{4,8}$]nonan-2-one, 2.67 g (15.7 mmol) of 3-methacryloyloxy-2-oxotetrahydrofuran, 3.70 g (15.7 mmol) of 1-hydroxy-3-methacryloyloxyadamantane, and 13.18 g (78.5 mmol) of 1-(1-methacryloyloxy-1-methylethyl)cyclopropane. The recovered polymer compound was analyzed by GPC and found to have a weight-average molecular weight (Mw) of 9500 and a molecular weight distribution (Mw/Mn) of 1.92.

[Chem. 14]

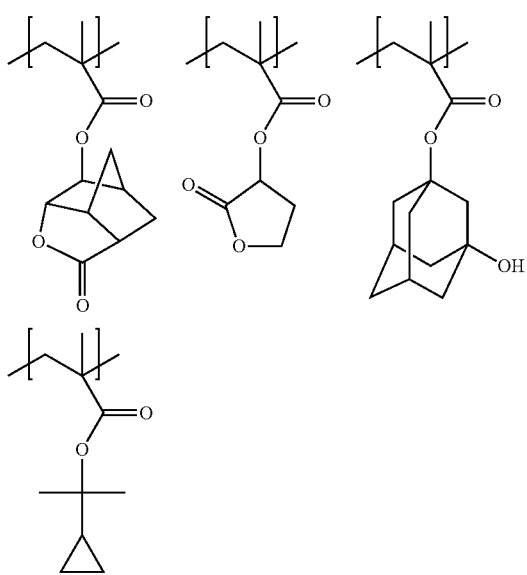

Example 3

Production of Polymer Compound Represented by Formula Given Below

The procedure of Example 1 was performed, except for using monomer components as follows, and yielded 26.8 g of the desired polymer compound. The monomer components were 15.30 g (54.6 mmol) of 5-(2-methacryloyloxyacetoxy)-3-oxatricyclo[4.2.1.0$^{4,8}$]nonan-2-one, 3.22 g (13.7 mmol) of 1-hydroxy-3-methacryloyloxyadamantane, and 11.48 g (68.3 mmol) of 1-(1-methacryloyloxy-1-methylethyl)cyclopropane. The recovered polymer compound was analyzed by GPC and found to have a weight-average molecular weight (Mw) of 8700 and a molecular weight distribution (Mw/Mn) of 1.88.

[Chem. 15]

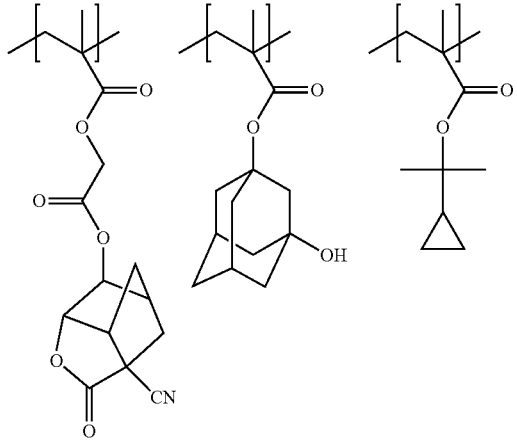

Example 4

Production of Polymer Compound Represented by Formula Given Below

The procedure of Example 1 was performed, except for using monomer components as follows, and yielded 27.1 g of the desired polymer compound. The monomer components were 14.36 g (58.1 mmol) of 1-cyano-5-methacryloyloxy-3-oxatricyclo[4.2.1.0$^{4,8}$]nonan-2-one, 3.43 g (14.57 mmol) of 1-hydroxy-3-methacryloyloxyadamantane, and 12.21 g (72.7 mmol) of 1-(1-methacryloyloxy-1-methylethyl)cyclopropane. The recovered polymer compound was analyzed by GPC and found to have a weight-average molecular weight (Mw) of 9100 and a molecular weight distribution (Mw/Mn) of 1.90.

[Chem. 16]

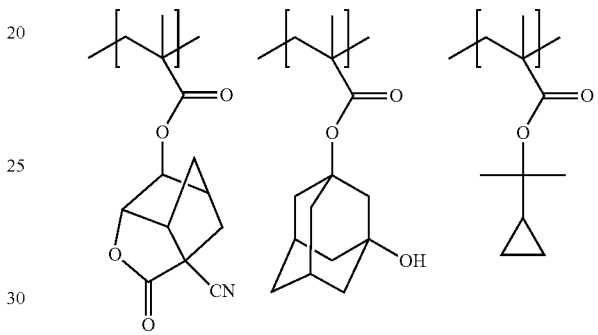

Example 5

Production of Polymer Compound Represented by Formula Given Below

The procedure of Example 1 was performed, except for using monomer components as follows, and yielded 26.6 g of the desired polymer compound. The monomer components were 11.19 g (45.3 mmol) of 1-cyano-5-methacryloyloxy-3-oxatricyclo[4.2.1.0$^{4,8}$]nonan-2-one, 2.57 g (15.1 mmol) of 3-methacryloyloxy-2-oxotetrahydrofuran, 3.56 g (15.1 mmol) of 1-hydroxy-3-methacryloyloxyadamantane, and 12.68 g (75.5 mmol) of 1-(1-methacryloyloxy-1-methylethyl)cyclopropane. The recovered polymer compound was analyzed by GPC and found to have a weight-average molecular weight (Mw) of 9300 and a molecular weight distribution (Mw/Mn) of 1.90.

[Chem. 17]

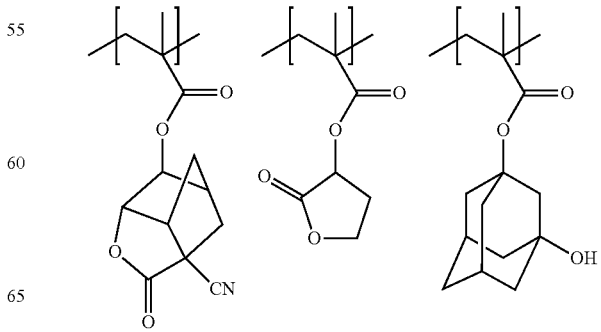

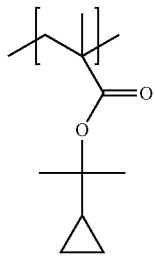

Example 6

Production of Polymer Compound Represented by Formula Given Below

The procedure of Example 1 was performed, except for using monomer components as follows, and yielded 26.7 g of the desired polymer compound. The monomer components were 15.94 g (52.3 mmol) of 1-cyano-5-(2-methacryloyloxy-acetoxy)-3-oxatricyclo[4.2.1.0$^{4,8}$]nonan-2-one, 3.08 g (13.1 mmol) of 1-hydroxy-3-methacryloyloxyadamantane, and 10.98 g (65.3 mmol) of 1-(1-methacryloyloxy-1-methylethyl)cyclopropane. The recovered polymer compound was analyzed by GPC and found to have a weight-average molecular weight (Mw) of 8500 and a molecular weight distribution (Mw/Mn) of 1.86.

[Chem. 18]

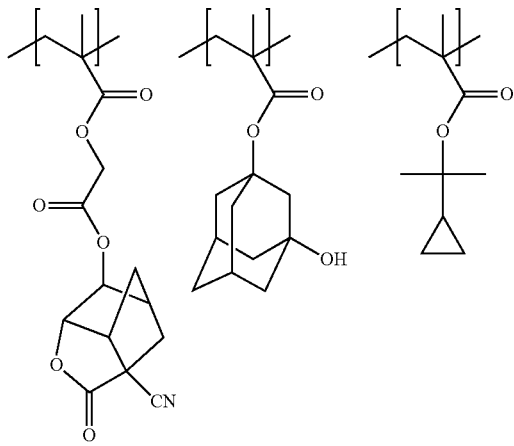

Example 7

Production of Polymer Compound Represented by Formula Given Below

The procedure of Example 1 was performed, except for using monomer components as follows, and yielded 25.6 g of the desired polymer compound. The monomer components were 19.34 g (63.4 mmol) of 1-cyano-5-(2-methacryloyloxy-acetoxy)-3-oxatricyclo[4.2.1.0$^{4,8}$]nonan-2-one and 10.66 g (63.4 mmol) of 1-(1-methacryloyloxy-1-methylethyl)cyclopropane. The recovered polymer compound was analyzed by GPC and found to have a weight-average molecular weight (Mw) of 8600 and a molecular weight distribution (Mw/Mn) of 1.84.

[Chem. 19]

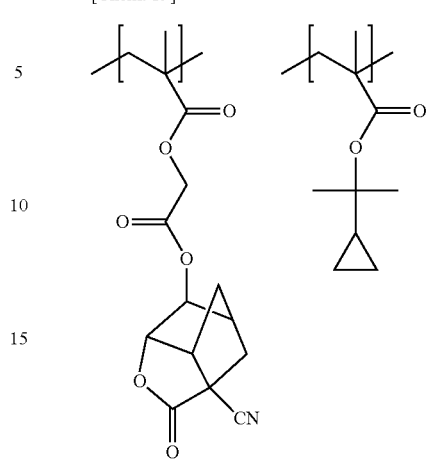

Example 8

Production of Polymer Compound Represented by Formula Given Below

The procedure of Example 1 was performed, except for using monomer components as follows, and yielded 27.1 g of the desired polymer compound. The monomer components were 14.69 g (56.9 mmol) of 5-methacryloyloxy-3-oxa-2-thiatricyclo[4.2.1.0$^{4,8}$]nonane-2,2-dione, 3.36 g (14.2 mmol) of 1-hydroxy-3-methacryloyloxyadamantane, and 11.95 g (71.2 mmol) of 1-(1-methacryloyloxy-1-methylethyl)cyclopropane. The recovered polymer compound was analyzed by GPC and found to have a weight-average molecular weight (Mw) of 8900 and a molecular weight distribution (Mw/Mn) of 1.88.

[Chem. 20]

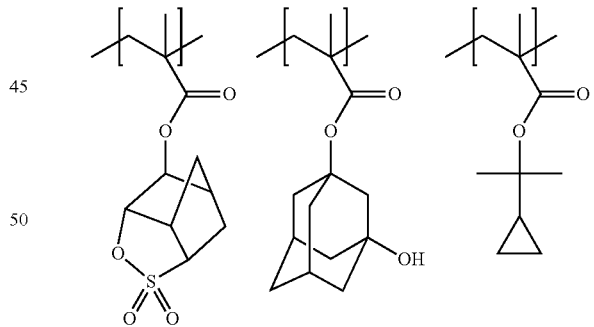

Example 9

Production of Polymer Compound Represented by Formula Given Below

The procedure of Example 1 was performed, except for using monomer components as follows, and yielded 27.5 g of the desired polymer compound. The monomer components were 12.94 g (58.3 mmol) of 5-methacryloyloxy-3-oxatricyclo[4.2.1.0$^{4,8}$]nonan-2-one, 3.44 g (14.6 mmol) of 1-hydroxy-3-methacryloyloxyadamantane, 9.80 g (58.3 mmol) of 1-(1-methacryloyloxy-1-methylethyl)cyclopropane, and 3.82 g (14.6 mmol) of 1-(1-methacryloyloxy-1-methylethyl)adamantane. The recovered polymer compound was analyzed by GPC and found to have a weight-average molecular weight (Mw) of 9000 and a dispersity (Mw/Mn) of 1.90.

[Chem. 21]

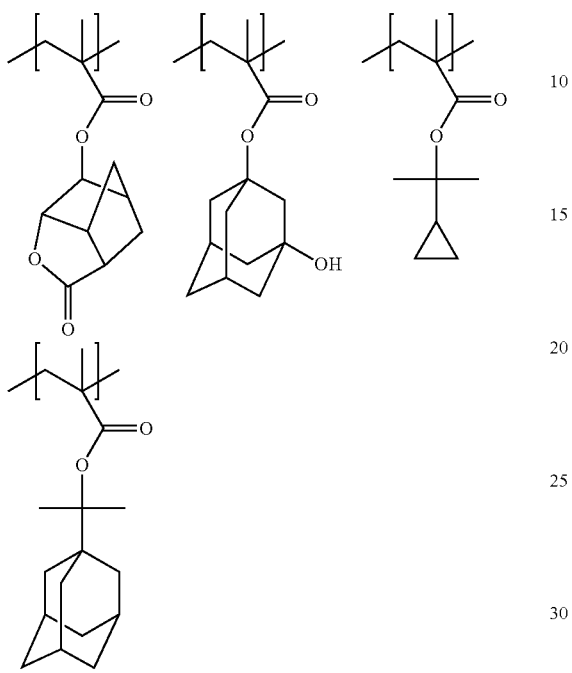

Example 10

Production of Polymer Compound Represented by Formula Given Below

The procedure of Example 1 was performed, except for using monomer components as follows, and yielded 25.4 g of the desired polymer compound. The monomer components were 9.96 g (44.9 mmol) of 5-methacryloyloxy-3-oxatricyclo[4.2.1.0$^{4,8}$]nonan-2-one, 5.08 g (29.9 mmol) of 3-methacryloyloxy-2-oxotetrahydrofuran, 7.54 g (44.9 mmol) of 1-(1-methacryloyloxy-1-methylethyl)cyclopropane, and 7.42 g (29.9 mmol) of 2-ethyl-2-methacryloyloxyadamantane. The recovered polymer compound was analyzed by GPC and found to have a weight-average molecular weight (Mw) of 8600 and a molecular weight distribution (Mw/Mn) of 1.85.

[Chem. 22]

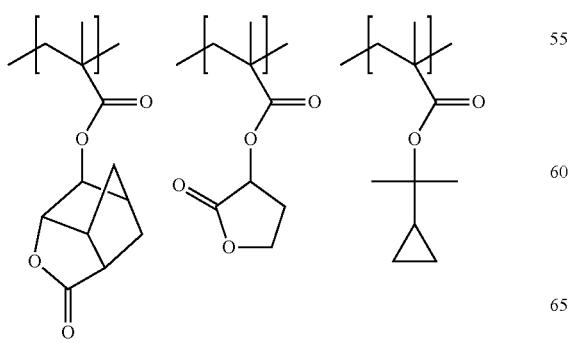

-continued

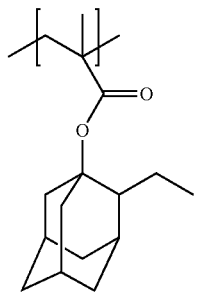

Example 11

Production of Polymer Compound Represented by Formula Given Below

The procedure of Example 1 was performed, except for using monomer components as follows, and yielded 25.9 g of the desired polymer compound. The monomer components were 14.17 g (57.4 mmol) of 1-cyano-5-methacryloyloxy-3-oxatricyclo[4.2.1.0$^{4,8}$]nonan-2-one, 3.38 g (14.3 mmol) of 1-hydroxy-3-methacryloyloxyadamantane, 7.23 g (43.0 mmol) of 1-(1-methacryloyloxy-1-methylethyl)cyclopropane, and 5.22 g (28.7 mmol) of 1-ethyl-1-methacryloyloxycyclopentane. The recovered polymer compound was analyzed by GPC and found to have a weight-average molecular weight (Mw) of 8300 and a molecular weight distribution (Mw/Mn) of 1.81.

[Chem. 23]

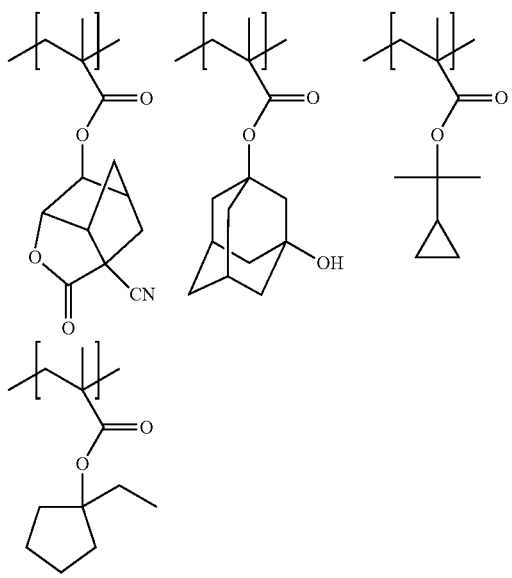

Example 12

Production of Polymer Compound Represented by Formula Given Below

The procedure of Example 1 was performed, except for using monomer components as follows, and yielded 27.0 g of the desired polymer compound. The monomer components were 13.73 g (55.6 mmol) of 1-cyano-5-methacryloyloxy-3-oxatricyclo[4.2.1.0⁴,⁸]nonan-2-one, 3.28 g (13.9 mmol) of 1-hydroxy-3-methacryloyloxyadamantane, 9.34 g (55.6 mmol) of 1-(1-methacryloyloxy-1-methylethyl)cyclopropane, and 3.64 g (13.9 mmol) of 1-(1-methacryloyloxy-1-methylethyl)adamantane. The recovered polymer compound was analyzed by GPC and found to have a weight-average molecular weight (Mw) of 8900 and a molecular weight distribution (Mw/Mn) of 1.88.

[Chem. 24]

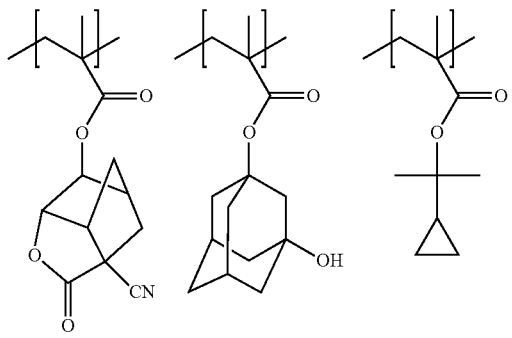

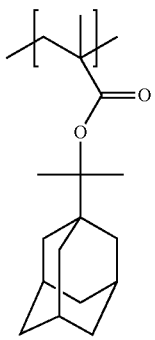

Example 13

Production of Polymer Compound Represented by Formula Given Below

The procedure of Example 1 was performed, except for using monomer components as follows, and yielded 26.9 g of the desired polymer compound. The monomer components were 14.73 g (48.3 mmol) of 1-cyano-5-(2-methacryloyloxyacetoxy)-3-oxatricyclo[4.2.1.0⁴,⁸]nonan-2-one, 2.85 g (12.1 mmol) of 1-hydroxy-3-methacryloyloxyadamantane, 6.09 g (36.2 mmol) of 1-(1-methacryloyloxy-1-methylethyl)cyclopropane, and 6.33 g (24.2 mmol) of 1-(1-methacryloyloxy-1-methylethyl)adamantane. The recovered polymer compound was analyzed by GPC and found to have a weight-average molecular weight (Mw) of 8600 and a molecular weight distribution (Mw/Mn) of 1.86.

[Chem. 25]

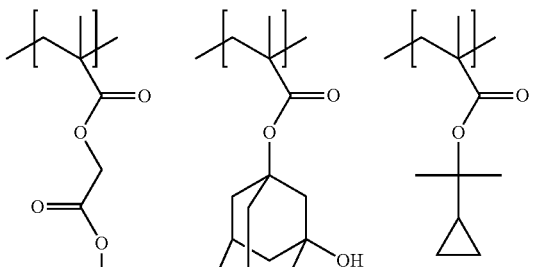

Example 14

Production of Polymer Compound Represented by Formula Given Below

The procedure of Example 1 was performed, except for using monomer components as follows, and yielded 26.5 g of the desired polymer compound. The monomer components were 11.24 g (36.8 mmol) of 1-cyano-5-(2-methacryloyloxyacetoxy)-3-oxatricyclo[4.2.1.0⁴,⁸]nonan-2-one, 2.09 g (12.3 mmol) of 3-methacryloyloxy-2-oxotetrahydrofuran, 2.90 g (12.3 mmol) of 1-hydroxy-3-methacryloyloxyadamantane, 4.13 g (24.6 mmol) of 1-(1-methacryloyloxy-1-methylethyl)cyclopropane, and 9.65 g (36.8 mmol) of 1-(1-methacryloyloxy-1-methylethyl)adamantane. The recovered polymer compound was analyzed by GPC and found to have a weight-average molecular weight (Mw) of 8700 and a molecular weight distribution (Mw/Mn) of 1.86.

[Chem. 26]

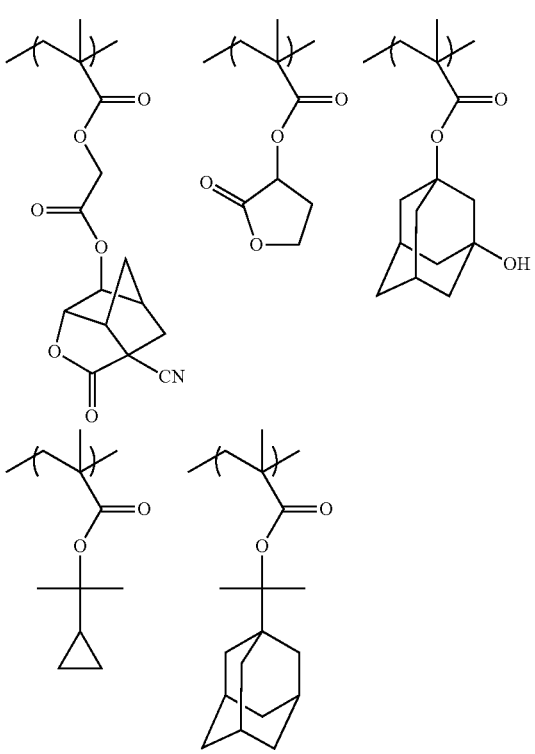

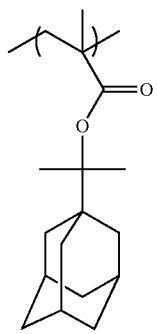

Example 15

Production of Polymer Compound Represented by Formula Given Below

The procedure of Example 1 was performed, except for using monomer components as follows, and yielded 27.2 g of the desired polymer compound. The monomer components were 14.06 g (54.5 mmol) of 5-methacryloyloxy-3-oxa-2-thiatricyclo[4.2.1.0$^{4,8}$]nonane-2,2-dione, 3.22 g (13.6 mmol) of 1-hydroxy-3-methacryloyloxyadamantane, 9.16 g (54.5 mmol) of 1-(1-methacryloyloxy-1-methylethyl)cyclopropane, and 3.57 g (13.6 mmol) of 1-(1-methacryloyloxy-1-methylethyl)adamantane. The recovered polymer compound was analyzed by GPC and found to have a weight-average molecular weight (Mw) of 9100 and a molecular weight distribution (Mw/Mn) of 1.92.

[Chem. 27]

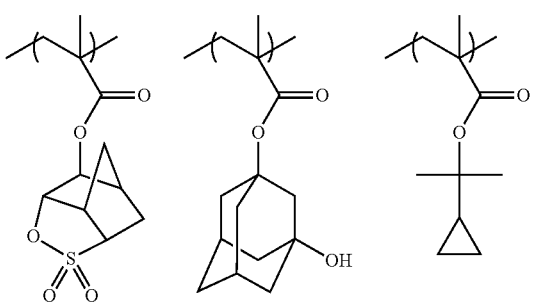

Example 16

Production of Polymer Compound Represented by Formula Given Below

The procedure of Example 1 was performed, except for using monomer components as follows, and yielded 26.1 g of the desired polymer compound. The monomer components were 10.98 g (42.6 mmol) of 5-methacryloyloxy-3-oxa-2-thiatricyclo[4.2.1.0$^{4,8}$]nonane-2,2-dione, 4.82 g (28.4 mmol) of 3-methacryloyloxy-2-oxotetrahydrofuran, 7.15 g (42.6 mmol) of 1-(1-methacryloyloxy-1-methylethyl)cyclopropane, and 7.04 g (28.4 mmol) of 2-ethyl-2-methacryloyloxyadamantane. The recovered polymer compound was analyzed by GPC and found to have a weight-average molecular weight (Mw) of 8400 and a molecular weight distribution (Mw/Mn) of 1.83.

[Chem. 28]

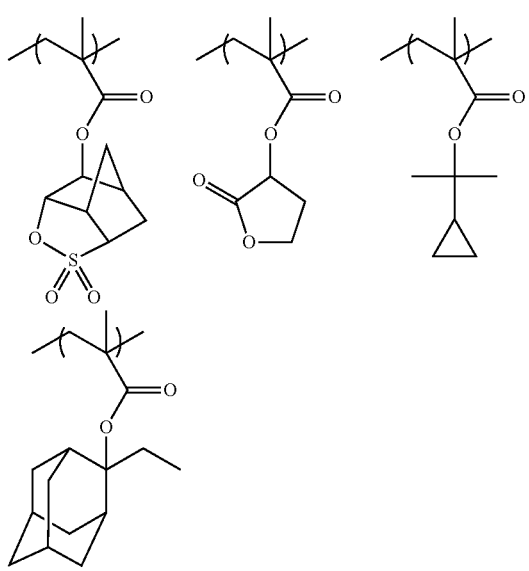

Comparative Example 1

Production of Polymer Compound Represented by Formula Given Below

The procedure of Example 1 was performed, except for using monomer components as follows, and yielded 27.6 g of the desired polymer compound. The monomer components were 10.94 g (49.3 mmol) of 5-methacryloyloxy-3-oxatricyclo[4.2.1.0$^{4,8}$]nonan-2-one, 2.91 g (12.3 mmol) of 1-hydroxy-3-methacryloyloxyadamantane, and 16.15 g (61.6 mmol) of 1-(1-methacryloyloxy-1-methylethyl)adamantane. The recovered polymer compound was analyzed by GPC and found to have a weight-average molecular weight (Mw) of 8400 and a molecular weight distribution (Mw/Mn) of 1.82.

[Chem. 29]

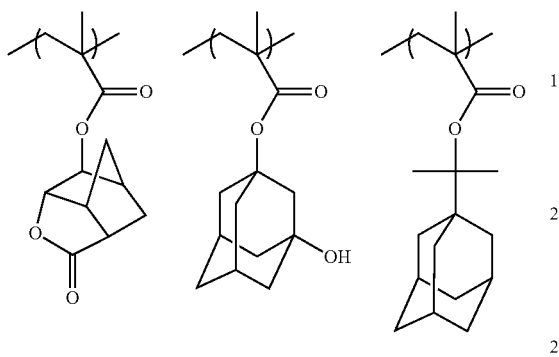

Comparative Example 2

Production of Polymer Compound Represented by Formula Given Below

The procedure of Example 1 was performed, except for using monomer components as follows, and yielded 27.3 g of the desired polymer compound. The monomer components were 11.70 g (47.4 mmol) of 1-cyano-5-methacryloyloxy-3-oxatricyclo[4.2.1.0$^{4,8}$]nonan-2-one, 2.79 g (11.8 mmol) of 1-hydroxy-3-methacryloyloxyadamantane, and 15.51 g (59.2 mmol) of 1-(1-methacryloyloxy-1-methylethyl)adamantane. The recovered polymer compound was analyzed by GPC and found to have a weight-average molecular weight (Mw) of 8500 and a molecular weight distribution (Mw/Mn) of 1.84.

[Chem. 30]

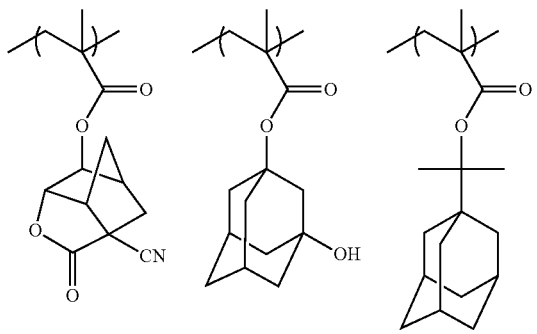

Comparative Example 3

Production of Polymer Compound Represented by Formula Given Below

The procedure of Example 1 was performed, except for using monomer components as follows, and yielded 28.1 g of the desired polymer compound. The monomer components were 12.01 g (46.5 mmol) of 5-methacryloyloxy-3-oxa-2-thiatricyclo[4.2.1.0$^{4,8}$]nonane-2,2-dione, 2.75 g (11.6 mmol) of 1-hydroxy-3-methacryloyloxyadamantane, and 15.24 g (58.2 mmol) of 1-(1-methacryloyloxy-1-methylethyl)adamantane. The recovered polymer compound was analyzed by GPC and found to have a weight-average molecular weight (Mw) of 8600 and a molecular weight distribution (Mw/Mn) of 1.85.

[Chem. 31]

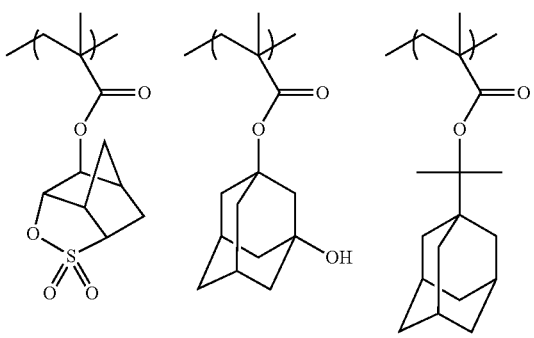

Example 17

Preparation of Photoresist Resin Composition

The polymer compound obtained in Example 1 (100 parts by weight) was combined with 3 parts by weight of triphenylsulfonium hexafluoroantimonate and 0.3 part by weight of 1,5-diazabicyclo[4.3.0]-5-nonene, further combined with propylene glycol monomethyl ether acetate (PGMEA), and yielded a photoresist resin composition having a polymer concentration of 10 percent by weight.

The prepared photoresist resin composition was filtrated through a 0.1-μm polyethylene filter, applied onto a silicon wafer by spin coating, subjected to a heat treatment at a temperature of 120° C. for 90 seconds, and yielded a photosensitive layer having a thickness of about 0.3 μm. The photosensitive layer was exposed to ArF excimer laser light at a wavelength of 193 nm in a line-and-space pattern, subjected to a heat treatment at a temperature of 120° C. for 90 seconds, developed with a 0.3 M tetramethylammonium hydroxide aqueous solution, rinsed with pure water, and yielded a 0.12-μm line-and-space pattern clearly and precisely.

Examples 18 to 32 and Comparative Examples 4 to 6

Preparation of Photoresist Resin Composition

Photoresist resin compositions were prepared by the procedure of Example 17, except for using each of the polymer compounds obtained in Examples 2 to 16 and Comparative Examples 1 to 3, instead of the polymer compound obtained in Example 1.

Line-and-space patterns were formed by the procedure of Example 17, except for using the obtained photoresist resin compositions. As a result, the resin compositions including the polymer compounds obtained in Examples 2 to 16 gave 0.12-μm line-and-space patterns clearly and precisely. In contrast, the resin compositions including the polymer compounds obtained in Comparative Examples 1 to 3 gave 0.12-µm line-and-space patterns, but with a multiplicity of resist scum in the space region.

INDUSTRIAL APPLICABILITY

The polymer compounds according to embodiments of the present invention have very high reactivity with an acid to release a compound (moiety) by the action of the acid, where the compound can be easily removed. The polymer compounds may cause approximately no scum. In addition, the polymer compounds exhibit excellent substrate adhesion and etch resistance. The polymer compounds according to embodiments of the present invention, when incorporated into photoresist resin compositions and used, can form fine patterns precisely.

The invention claimed is:
1. A polymer compound, comprising:
a monomer unit (a) represented by Formula (a); and
a monomer unit (b) comprising an alicyclic skeleton comprising a polar group,
Formula (a) expressed as follows:

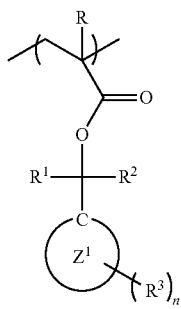

(a)

wherein R is selected from hydrogen, halogen, and optionally halogenated $C_1$-$C_6$ alkyl; $R^1$ and $R^2$ each represent, identically or differently, optionally substituted $C_1$-$C_6$ alkyl; $R^3$ is a substituent bonded to Ring $Z^1$ and is, independently in each occurrence, selected from oxo, alkyl, optionally protected hydroxyl, optionally protected hydroxyalkyl, optionally protected carboxy, and cyano; n represents an integer from 0 to 3, where, when n is 2 or 3, two or three occurrences of $R^3$ may be identical or different; and Ring $Z^1$ represents a $C_3$ or $C_4$ alicyclic hydrocarbon ring,
wherein the monomer unit (b) comprises at least one selected from the group consisting of monomer units (b1) to (b5) respectively represented by Formulae (b1) to (b5):

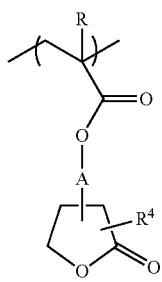

(b1)

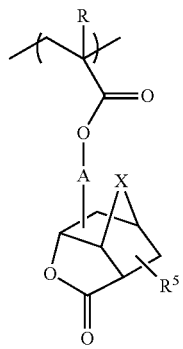

(b2)

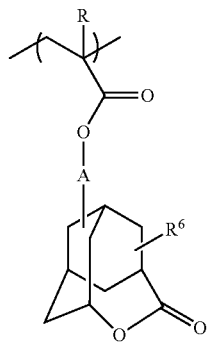

(b3)

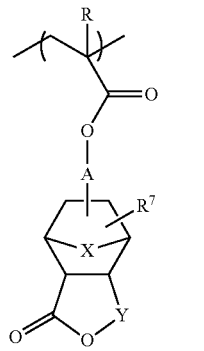

(b4)

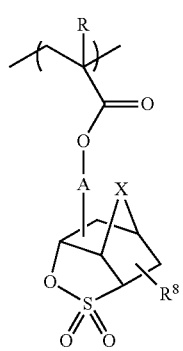

(b5)

wherein R is, independently in each occurrence, selected from hydrogen, halogen, and optionally halogenated $C_1$-$C_6$ alkyl; A is, independently in each occurrence, selected from a single bond and a linkage group; X is, independently in each occurrence, selected from non-bond, methylene, ethylene, oxygen, and sulfur; Y is selected from methylene and carbonyl; $R^4$, $R^5$, $R^6$, $R^7$, and $R^8$ are each, identically or differently, selected from hydrogen, alkyl, optionally protected hydroxyl, optionally protected hydroxyalkyl, optionally protected carboxy, and cyano.

2. The polymer compound according to claim 1,
wherein the polymer compound has a weight-average molecular weight of from 1000 to 50000.

3. The polymer compound according to claim 2,
wherein the polymer compound has a weight-average molecular weight of Mw and a number-average molecular weight of Mn and has a molecular weight distribution Mw/Mn of from 1.0 to 3.0, where the molecular weight distribution is a ratio of Mw to Mn.

4. A photoresist resin composition, comprising:
the polymer compound according to claim 2;
a photoacid generator; and
an organic solvent.

5. A method for producing a semiconductor structure, the method comprising:
forming a pattern using the photoresist resin composition according to claim 4.

6. The polymer compound according to claim 1,
wherein the polymer compound has a weight-average molecular weight of Mw and a number-average molecular weight of Mn and has a molecular weight distribution Mw/Mn of from 1.0 to 3.0, where the molecular weight distribution is a ratio of Mw to Mn.

7. A photoresist resin composition, comprising:
the polymer compound according to claim 1;
a photoacid generator; and
an organic solvent.

8. A method for producing a semiconductor structure, the method comprising:
forming a pattern using the photoresist resin composition according to claim 7.

9. A polymer compound, comprising:
a monomer unit (a) represented by Formula (a); and
a monomer unit (b) comprising an alicyclic skeleton comprising a polar group,
Formula (a) expressed as follows:

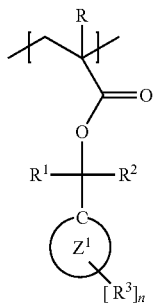

(a)

wherein R is selected from hydrogen, halogen, and optionally halogenated $C_1$-$C_6$ alkyl; $R^1$ and $R^2$ each represent, identically or differently, optionally substituted $C_1$-$C_6$ alkyl; $R^3$ is a substituent bonded to Ring $Z^1$ and is, independently in each occurrence, selected from oxo, alkyl, optionally protected hydroxyl, optionally protected hydroxyalkyl, optionally protected carboxy, and cyano; n represents an integer from 0 to 3, where, when n is 2 or 3, two or three occurrences of $R^3$ may be identical or different; and Ring $Z^1$ represents a $C_3$ or $C_4$ alicyclic hydrocarbon ring,
  further comprising at least one monomer unit (c) selected from the group consisting of monomer units (c1) to (c4) respectively represented by Formulae (c1) to (c4):

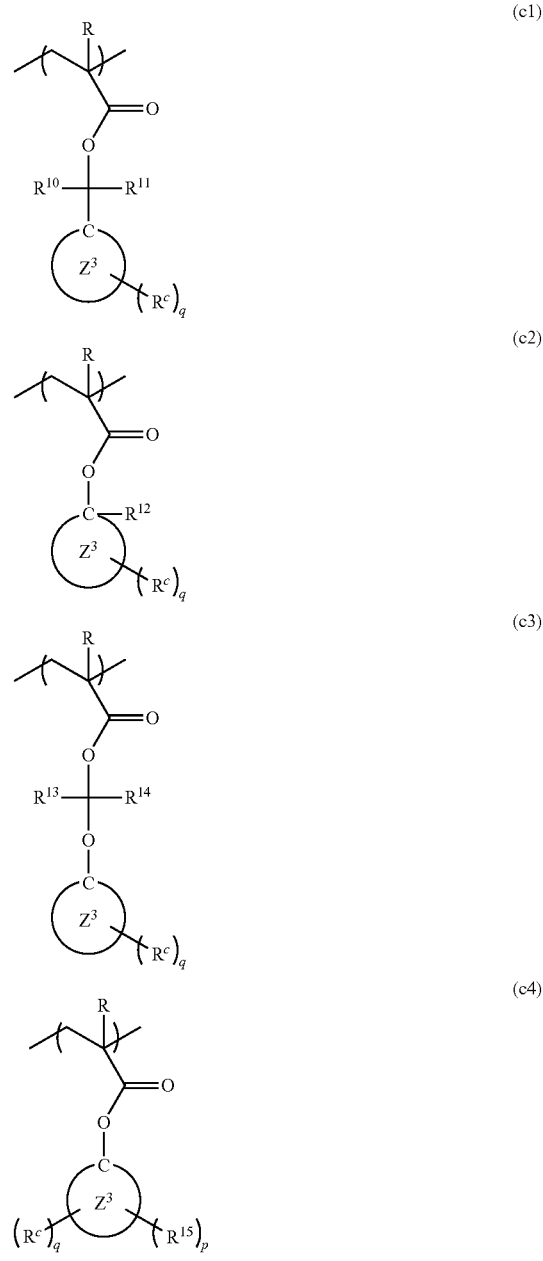

wherein R is, independently in each occurrence, selected from hydrogen, halogen, and optionally halogenated $C_1$-$C_6$ alkyl; $R^{10}$, $R^{11}$, and $R^{12}$ each represent, identically or differently, optionally substituted $C_1$-$C_6$ alkyl; $R^{13}$ and $R^{14}$ are each, identically or differently, selected from hydrogen and optionally substituted $C_1$-$C_6$ alkyl; $R^{15}$ represents, independently in each occurrence, —COOR$^d$, where R$^d$ is selected from an optionally substituted tertiary hydrocarbon group, tetrahydrofuranyl, tetrahydropyranyl, and oxepanyl; p represents an integer from 1 to 3; R$^c$ is a substituent bonded to Ring $Z^3$ and is, identically or differently in each occurrence, selected from oxo, alkyl, optionally protected hydroxyl, optionally protected hydroxyalkyl, and optionally protected carboxy; q represents, independently in each occurrence, an integer from 0 to 3; and Ring $Z^3$ represents, independently in each occurrence, a $C_5$-$C_{20}$ alicyclic hydrocarbon ring.

10. The polymer compound according to claim 9, wherein the polar group of the monomer unit (b) comprises at least one group selected from the group consisting of —O—, —C(=O)—, —C(=O)—O—, —O—C(=O)—O—, —C(=O)—O—C(=O)—, —C(=O)—NH—, —S(=O)—O—, —S(=O)$_2$—O—, —OR$^a$, —C(=O)—OR$^a$, and —CN, where R$^a$ represents, independently in each occurrence, optionally substituted alkyl.

11. The polymer compound according to claim 10, wherein the monomer unit (b) comprises at least one selected from the group consisting

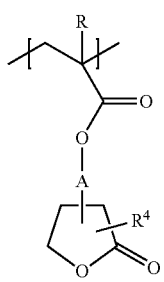

(b1)

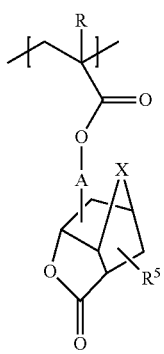

(b2)

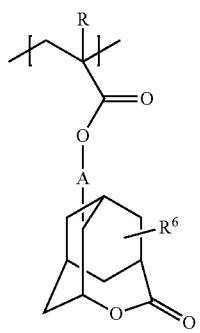

(b3)

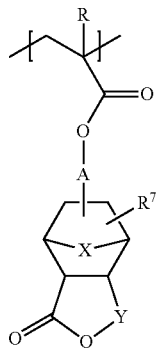

(b4)

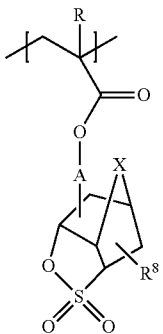

(b5)

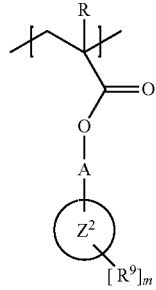

(b6)

of monomer units (b1) to (b6) respectively represented by Formulae (b1) to (b6):

wherein R is, independently in each occurrence, selected from hydrogen, halogen, and optionally halogenated $C_1$-$C_6$ alkyl; A is, independently in each occurrence, selected from a single bond and a linkage group; X is, independently in each occurrence, selected from non-bond, methylene, ethylene, oxygen, and sulfur; Y is selected from methylene and carbonyl; $R^4$, $R^5$, $R^6$, $R^7$, and $R^8$ are each, identically or differently, selected from hydrogen, alkyl, optionally protected hydroxyl, optionally protected hydroxyalkyl, optionally protected carboxy, and cyano; $R^9$ is, independently in each occurrence, selected from optionally protected hydroxyl, optionally protected hydroxyalkyl, optionally protected carboxy, and cyano; Ring $Z^2$ represents a $C_6$-$C_{20}$ alicyclic hydrocarbon ring; and m represents an integer from 1 to 5.

12. The polymer compound according to claim 10, wherein the polymer compound has a weight-average molecular weight of from 1000 to 50000.

13. The polymer compound according to claim 10, wherein the polymer compound has a weight-average molecular weight of Mw and a number-average molecular weight of Mn and has a molecular weight distribution Mw/Mn of from 1.0 to 3.0, where the molecular weight distribution is a ratio of Mw to Mn.

14. A photoresist resin composition, comprising:
   the polymer compound according to claim 10;
   a photoacid generator; and
   an organic solvent.

15. A method for producing a semiconductor structure, the method comprising:
   forming a pattern using the photoresist resin composition according to claim 14.

16. The polymer compound according to claim 9,
   wherein the monomer unit (b) comprises at least one selected from the group consisting of monomer units (b1) to (b6) respectively represented by Formulae (b1) to (b6):

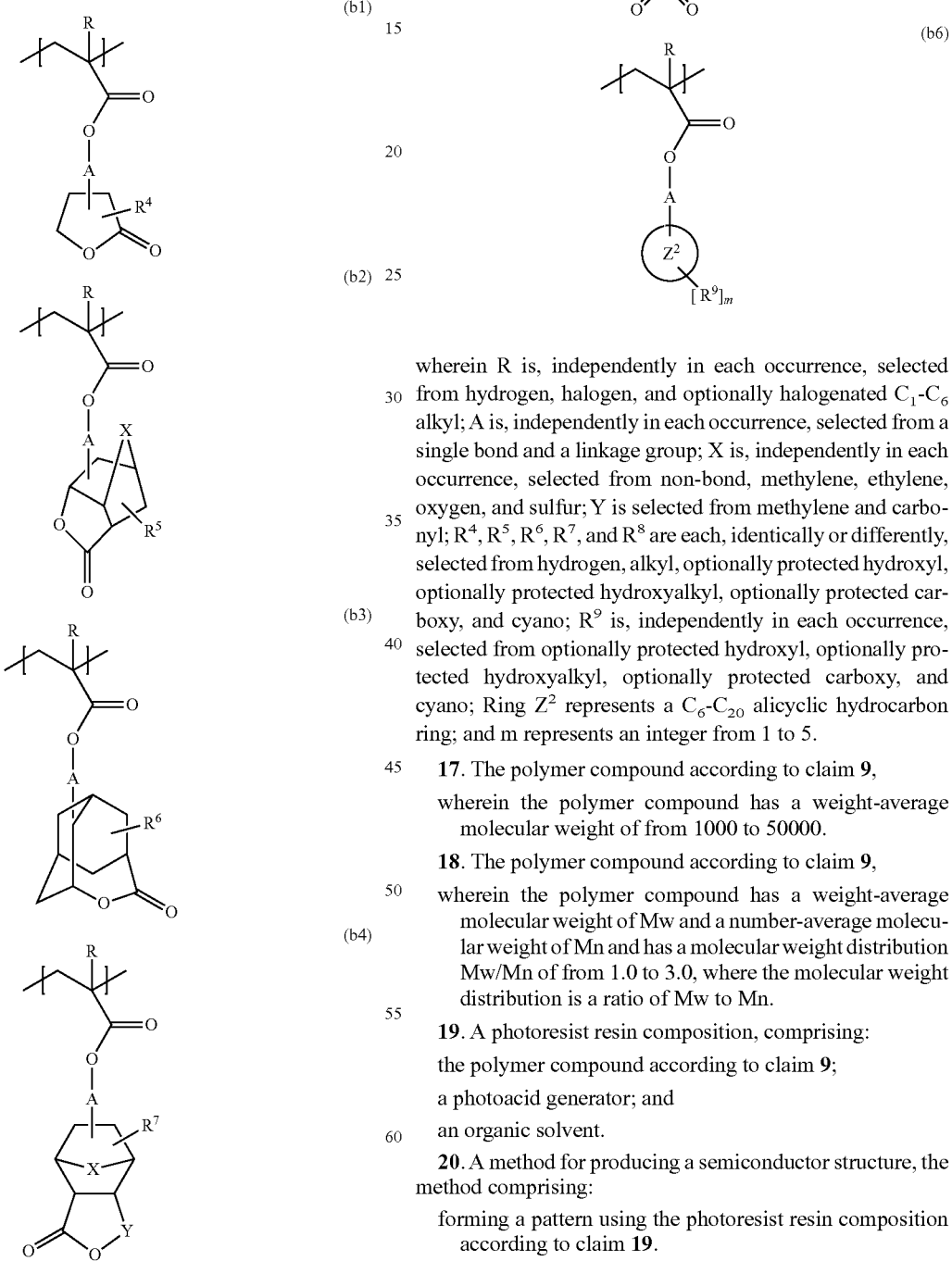

wherein R is, independently in each occurrence, selected from hydrogen, halogen, and optionally halogenated $C_1$-$C_6$ alkyl; A is, independently in each occurrence, selected from a single bond and a linkage group; X is, independently in each occurrence, selected from non-bond, methylene, ethylene, oxygen, and sulfur; Y is selected from methylene and carbonyl; $R^4$, $R^5$, $R^6$, $R^7$, and $R^8$ are each, identically or differently, selected from hydrogen, alkyl, optionally protected hydroxyl, optionally protected hydroxyalkyl, optionally protected carboxy, and cyano; $R^9$ is, independently in each occurrence, selected from optionally protected hydroxyl, optionally protected hydroxyalkyl, optionally protected carboxy, and cyano; Ring $Z^2$ represents a $C_6$-$C_{20}$ alicyclic hydrocarbon ring; and m represents an integer from 1 to 5.

17. The polymer compound according to claim 9,
   wherein the polymer compound has a weight-average molecular weight of from 1000 to 50000.

18. The polymer compound according to claim 9,
   wherein the polymer compound has a weight-average molecular weight of Mw and a number-average molecular weight of Mn and has a molecular weight distribution Mw/Mn of from 1.0 to 3.0, where the molecular weight distribution is a ratio of Mw to Mn.

19. A photoresist resin composition, comprising:
   the polymer compound according to claim 9;
   a photoacid generator; and
   an organic solvent.

20. A method for producing a semiconductor structure, the method comprising:
   forming a pattern using the photoresist resin composition according to claim 19.

* * * * *